(12) United States Patent
Yamazaki et al.

(10) Patent No.: US 9,741,863 B2
(45) Date of Patent: Aug. 22, 2017

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/848,486

(22) Filed: Sep. 9, 2015

(65) Prior Publication Data

US 2016/0005874 A1    Jan. 7, 2016

Related U.S. Application Data

(63) Continuation of application No. 14/472,605, filed on Aug. 29, 2014, now Pat. No. 9,136,391, which is a
(Continued)

(30) Foreign Application Priority Data

Jan. 22, 2010    (JP) .................................. 2010-012627

(51) Int. Cl.
*H01L 29/78* (2006.01)
*H01L 29/786* (2006.01)
(Continued)

(52) U.S. Cl.
CPC ...... *H01L 29/7869* (2013.01); *H01L 27/1225* (2013.01); *H01L 29/045* (2013.01);
(Continued)

(58) Field of Classification Search
CPC ............... H01L 29/7869; H01L 29/786; H01L 29/0657; H01L 27/1225; H01L 27/1255; H01L 29/78645
(Continued)

(56) References Cited

U.S. PATENT DOCUMENTS 5,367,180 A    11/1994    Asai et al.
5,402,081 A    3/1995    Wong et al.
(Continued)

FOREIGN PATENT DOCUMENTS

EP    1737044 A    12/2006
EP    1801887 A    6/2007
(Continued)

OTHER PUBLICATIONS

Taiwanese Office Action (Application No. 100101094) Dated Dec. 8, 2015.
(Continued)

*Primary Examiner* — Nathan W Ha
(74) *Attorney, Agent, or Firm* — Fish & Richardson P.C.

(57) ABSTRACT

The semiconductor device includes a power element which is in an on state when voltage is not applied to a gate, a switching field-effect transistor for applying first voltage to the gate of the power element, and a switching field-effect transistor for applying voltage lower than the first voltage to the gate of the power element. The switching field-effect transistors have small off-state current.

45 Claims, 18 Drawing Sheets

Related U.S. Application Data continuation of application No. 13/729,272, filed on Dec. 28, 2012, now Pat. No. 8,823,439, which is a continuation of application No. 13/010,024, filed on Jan. 2, 2011, now Pat. No. 8,344,788.

(51) Int. Cl.

| | |
|---|---|
| *H03K 17/082* | (2006.01) |
| *H01L 29/06* | (2006.01) |
| *H01L 29/04* | (2006.01) |
| *H01L 29/10* | (2006.01) |
| *H01L 29/24* | (2006.01) |
| *H01L 29/45* | (2006.01) |
| *H01L 27/12* | (2006.01) |

(52) U.S. Cl.
CPC ...... *H01L 29/0657* (2013.01); *H01L 29/1033* (2013.01); *H01L 29/24* (2013.01); *H01L 29/45* (2013.01); *H01L 29/78645* (2013.01); *H03K 17/0822* (2013.01); *H01L 27/1255* (2013.01)

(58) Field of Classification Search
USPC .......................................................... 257/59
See application file for complete search history.

(56) References Cited

U.S. PATENT DOCUMENTS

| | | | |
|---|---|---|---|
| 5,714,869 A | 2/1998 | Tamechika et al. |
| 5,731,732 A | 3/1998 | Williams |
| 5,731,856 A | 3/1998 | Kim et al. |
| 5,744,864 A | 4/1998 | Cillessen et al. |
| 5,880,603 A | 3/1999 | Shigehara et al. |
| 5,917,210 A | 6/1999 | Huang et al. |
| 6,111,321 A | 8/2000 | Agarwala |
| 6,294,274 B1 | 9/2001 | Kawazoe et al. |
| 6,399,988 B1 | 6/2002 | Yamazaki |
| 6,563,174 B2 | 5/2003 | Kawasaki et al. |
| 6,579,736 B2 | 6/2003 | Yamazaki |
| RE38,319 E | 11/2003 | Lin et al. |
| 6,727,522 B1 | 4/2004 | Kawasaki et al. |
| 6,795,286 B2 | 9/2004 | Maloney et al. |
| 6,867,957 B1 | 3/2005 | Tong et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,081,931 B2 | 7/2006 | Matsui et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,314,801 B2 | 1/2008 | Kiesel et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,537,976 B2 | 5/2009 | Hirose |
| 7,626,790 B2 | 12/2009 | Hung |
| 7,642,573 B2 | 1/2010 | Hoffman et al. |
| 7,674,650 B2 | 3/2010 | Akimoto et al. |
| 7,687,808 B2 | 3/2010 | Umezaki |
| 7,719,235 B2 | 5/2010 | Sano et al. |
| 7,732,251 B2 | 6/2010 | Hoffman et al. |
| 7,732,819 B2 | 6/2010 | Akimoto et al. |
| 7,749,825 B2 | 7/2010 | Honda |
| 7,782,098 B2 | 8/2010 | Hashimoto et al. |
| 7,791,074 B2 | 9/2010 | Iwasaki |
| 7,838,348 B2 | 11/2010 | Hoffman et al. |
| 7,851,792 B2 | 12/2010 | Aiba et al. |
| 7,935,582 B2 | 5/2011 | Iwasaki |
| 7,956,361 B2 | 6/2011 | Iwasaki |
| 7,964,876 B2 | 6/2011 | Umezaki |
| 8,077,266 B2 | 12/2011 | Nakamura et al. |
| 8,129,717 B2 | 3/2012 | Yamazaki et al. |
| 8,154,024 B2 | 4/2012 | Iwasaki |
| 8,202,365 B2 | 6/2012 | Umeda et al. |
| 8,203,144 B2 | 6/2012 | Hoffman et al. |
| 8,222,098 B2 | 7/2012 | Honda |
| 8,344,788 B2 | 1/2013 | Yamazaki et al. |
| 8,367,486 B2 | 2/2013 | Sakata |
| 8,383,472 B2 | 2/2013 | Yin et al. |
| 8,384,076 B2 | 2/2013 | Park et al. |
| 8,384,077 B2 | 2/2013 | Yano et al. |
| 8,384,439 B2 | 2/2013 | Park et al. |
| 8,422,180 B2 | 4/2013 | Lin et al. |
| 8,598,591 B2 | 12/2013 | Umezaki |
| 8,647,031 B2 | 2/2014 | Hoffman et al. |
| 8,723,173 B2 | 5/2014 | Yamazaki et al. |
| 8,735,194 B2 | 5/2014 | Takahashi et al. |
| 8,785,990 B2 | 7/2014 | Honda |
| 8,823,439 B2 | 9/2014 | Yamazaki et al. |
| 8,981,369 B2 | 3/2015 | Yano et al. |
| 9,312,393 B2 | 4/2016 | Honda |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0036072 A1 | 2/2004 | Tsujimura et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0056847 A1 | 3/2005 | Nakamura et al. |
| 2005/0199959 A1 | 9/2005 | Chiang et al. |
| 2005/0199960 A1 | 9/2005 | Hoffman et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0263576 A1 | 11/2006 | Hirose |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0141789 A1 | 6/2007 | Kiesel et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0001184 A1 | 1/2008 | Genrikh et al. |
| 2008/0006877 A1 | 1/2008 | Mardilovich et al. |
| 2008/0032443 A1* | 2/2008 | Wu .................. H01L 29/7869 438/104 |
| 2008/0038882 A1 | 2/2008 | Takechi et al. |
| 2008/0038929 A1 | 2/2008 | Chang |

(56) References Cited

U.S. PATENT DOCUMENTS

| | | |
|---|---|---|
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1* | 6/2008 | Lee .................. H01L 29/7869 257/43 |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0252843 A1 | 10/2008 | Koike et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0001384 A1 | 1/2009 | Kosaki et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140438 A1 | 6/2009 | Yamazaki et al. |
| 2009/0152506 A1 | 6/2009 | Umeda et al. |
| 2009/0152541 A1 | 6/2009 | Maekawa et al. |
| 2009/0206332 A1* | 8/2009 | Son .................. H01L 29/42384 257/43 |
| 2009/0231021 A1 | 9/2009 | Koyama et al. |
| 2009/0278122 A1 | 11/2009 | Hosono et al. |
| 2009/0280600 A1 | 11/2009 | Hosono et al. |
| 2009/0305468 A1* | 12/2009 | Jung .................. H01L 29/7869 438/151 |
| 2010/0059745 A1* | 3/2010 | Yoon .................. H01L 27/1214 257/43 |
| 2010/0065844 A1 | 3/2010 | Tokunaga |
| 2010/0085081 A1 | 4/2010 | Ofuji et al. |
| 2010/0092800 A1 | 4/2010 | Itagaki et al. |
| 2010/0109002 A1 | 5/2010 | Itagaki et al. |
| 2011/0101356 A1 | 5/2011 | Yamazaki |
| 2011/0121284 A1 | 5/2011 | Yamazaki et al. |
| 2011/0121288 A1 | 5/2011 | Yamazaki et al. |
| 2012/0154346 A1 | 6/2012 | Hirose |
| 2012/0286263 A1* | 11/2012 | Miyake .................. H01L 27/1225 257/43 |

FOREIGN PATENT DOCUMENTS

| | | |
|---|---|---|
| EP | 1915784 A | 4/2008 |
| EP | 2015439 A | 1/2009 |
| EP | 2120267 A | 11/2009 |
| EP | 2226847 A | 9/2010 |
| EP | 2339639 A | 6/2011 |
| EP | 2408011 A | 1/2012 |
| EP | 2816607 A | 12/2014 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-003320 A | 1/1993 |
| JP | 05-251705 A | 9/1993 |
| JP | 08-264794 A | 10/1996 |
| JP | 09-121470 A | 5/1997 |
| JP | 11-504761 | 4/1999 |
| JP | 11-505377 | 5/1999 |
| JP | 11-186543 A | 7/1999 |
| JP | 2000-044236 A | 2/2000 |
| JP | 2000-150900 A | 5/2000 |
| JP | 2000-349299 A | 12/2000 |
| JP | 2001-251772 A | 9/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-226890 A | 8/2004 |
| JP | 2004-273614 A | 9/2004 |
| JP | 2004-273732 A | 9/2004 |
| JP | 2005-084416 A | 3/2005 |
| JP | 2006-286772 A | 10/2006 |
| JP | 2006-352087 A | 12/2006 |
| JP | 2007-103918 A | 4/2007 |
| JP | 2007-134687 A | 5/2007 |
| JP | 2007-158307 A | 6/2007 |
| JP | 2007-173307 A | 7/2007 |
| JP | 2007-173820 A | 7/2007 |
| JP | 2007-200817 A | 8/2007 |
| JP | 2007-228724 A | 9/2007 |
| JP | 2007-529118 | 10/2007 |
| JP | 2007-529119 | 10/2007 |
| JP | 2008-089874 A | 4/2008 |
| JP | 2008-277665 A | 11/2008 |
| JP | 2009-004733 A | 1/2009 |
| JP | 2009-010142 A | 1/2009 |
| JP | 2009-021823 A | 1/2009 |
| JP | 2009-099502 A | 5/2009 |
| JP | 2009-117619 A | 5/2009 |
| JP | 2009-158940 A | 7/2009 |
| JP | 2009-167087 A | 7/2009 |
| JP | 2009-200891 A | 9/2009 |
| JP | 2009-278115 A | 11/2009 |
| JP | 2011-172217 A | 9/2011 |
| KR | 2008-0052107 A | 6/2008 |
| WO | WO-96/22616 | 7/1996 |
| WO | WO-2004/114391 | 12/2004 |
| WO | WO-2005/093849 | 10/2005 |
| WO | WO-2005/093850 | 10/2005 |
| WO | WO-2007/029844 | 3/2007 |
| WO | WO-2007/043493 | 4/2007 |
| WO | WO-2007/055256 | 5/2007 |
| WO | WO-2007/125671 | 11/2007 |
| WO | WO-2008/143304 | 11/2008 |
| WO | WO-2009/051041 | 4/2009 |
| WO | WO-2009/075281 | 6/2009 |
| WO | WO-2011/089841 | 7/2011 |

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

(56) References Cited

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "Temperature Dependence of Characteristics and Electronic Structure for Amorphous In—Ga—Zn-Oxide TFT", AM-FPD'09 Digest of Technical Papers, Jul. 1, 2009, pp. 41-44.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, 2317, ECS.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: MG, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett.(Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M, "Synthesis of Homologous Compound with New Long-Period Structure", Nirim Newsletter, Mar. 1, 1995, vol. 150, pp. 1-4.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 3000, No. 5623, pp. 1269-1272.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

(56) References Cited

OTHER PUBLICATIONS

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. Amoled Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/JP2010/073844) Dated Feb. 1, 2011.

Written Opinion (Application No. PCT/JP2010/073844) Dated Feb. 1, 2011.

Taiwanese Office Action (Application No. 105124149) dated Jan. 17, 2017.

Korean Office Action (Application No. 2015-7035900) dated Mar. 10, 2017.

\* cited by examiner

SEMICONDUCTOR DEVICE

This application is a continuation of U.S. application Ser. No. 14/472,605, filed Aug. 29, 2014, now allowed, which is a continuation of U.S. application Ser. No. 13/729,272, filed Dec. 28, 2012, now U.S. Pat. No. 8,823,439, which is a continuation of U.S. application Ser. No. 13/010,024, filed Jan. 20, 2011, now U.S. Pat. No. 8,344,788, which claims the benefit of a foreign priority application filed in Japan as Serial No. 2010-012627 on Jan. 22, 2010, all of which are incorporated by reference.

TECHNICAL FIELD

The present invention relates to a semiconductor device and a driving method thereof. Further, the present invention relates to an electronic device provided therewith.

In this specification and the like, the term "semiconductor device" means all devices that can operate by utilizing semiconductor characteristics. For example, a power device, a display device including the power device, an integrated circuit including the power device, and the like are included in the category of the semiconductor device.

BACKGROUND ART

As a semiconductor device used for a power device, a power device manufactured with the use of a silicon material is widely prevalent. The power device including silicon has a narrow band gap; therefore, the operation range is limited at high temperature. Thus, in recent years, a power device including SiC or GaN, which has a wide band gap, has been developed (see Patent Document 1, for example).

REFERENCE

Patent Document

[Patent Document 1] Japanese Published Patent Application No. 2009-010142

DISCLOSURE OF INVENTION

As an example of a power device including GaN, a heterojunction field-effect transistor (HFET) can be given. In the HFET, an AlN layer, a GaN layer, and an AlGaN layer, which are buffer layers, are stacked over a SiC substrate, and a source electrode, a gate electrode, and a drain electrode are formed over the AlGaN layer. Further, because of a difference between a band gap of the GaN layer and a band gap of the AlGaN layer, a high concentration two dimensional electron gas layer is formed at the interface between the GaN layer and the AlGaN layer. Since the energy level is lower than the Fermi level in a conduction band of the two dimensional electron gas layer, the two dimensional electron gas layer serves as a channel in the HFET and the HFET is in a normally-on state in which current flows even when voltage is not applied to a gate, causing a problem in that a circuit configuration of a driver circuit or a protective circuit is complicated. When an electron concentration is simply reduced in order to obtain a normally-off power device, resistance of an element is increased. Therefore, it is extremely difficult to achieve both a normally-off state of a power device and a low resistance of the power device at the same time. Further, an attempt has been made to realize a normally-off device with an innovative structure; however, a device structure becomes complicated and manufacturing cost is increased, which is a problem.

Therefore, it is an object of one embodiment of the present invention to provide a semiconductor which can realize an off state device without increase in power consumption.

One embodiment of the present invention is a semiconductor device including a power element which is in an on state when voltage is not applied to a gate, a switching field-effect transistor for applying first voltage to the gate of the power element, and a switching field-effect transistor for applying voltage lower than the first voltage to the gate of the power element. The switching field-effect transistors have small off-state current. Further, each of the switching field-effect transistors is a semiconductor device in which a channel region is formed using an i-type or substantially i-type oxide semiconductor layer. With the switching field-effect transistors, the power element is turned on or off by application of a high potential or a low potential to the gate of the power element.

One embodiment of the present invention is a semiconductor device including a power MOSFET in which a first gate and a second gate are included and a channel region is formed using an n-type oxide semiconductor layer, a switching field-effect transistor for applying positive voltage to the first gate and the second gate of the power MOSFET, and a switching field-effect transistor for applying negative voltage to the first gate and the second gate of the power MOSFET. A node of the first gate and the second gate of the power MOSFET is connected to the switching field-effect transistors, and a channel region of each of the switching field-effect transistors is formed using an i-type or substantially i-type oxide semiconductor layer. With the switching field-effect transistors, a high potential or a low potential is applied to the first gate and the second gate of the power MOSFET so that the power MOSFET is turned on or off.

One embodiment of the present invention is a semiconductor device including a first field-effect transistor connected to a high voltage generation source, a second field-effect transistor connected to the first field-effect transistor, a third field-effect transistor connected to the second field-effect transistor and a low voltage generation source, a capacitor connected to the second field-effect transistor and the third field-effect transistor, and a power MOSFET connected to the first field-effect transistor and the second field-effect transistor. The power MOSFET includes a first gate, a second gate, a first insulating layer in contact with the first gate, a second insulating layer in contact with the second gate, an oxide semiconductor layer formed between the first insulating layer and the second insulating layer, and a first terminal and a second terminal which are in contact with the oxide semiconductor layer and serve as a source region and a drain region. A node of the first gate and the second gate is connected to the first field-effect transistor and the second field-effect transistor. A channel formation region of each of the first to third field-effect transistors is formed using an i-type oxide semiconductor layer. The oxide semiconductor layer of the power MOSFET is n-type.

The carrier concentration of the oxide semiconductor layer in the power MOSFET is higher than or equal to $1 \times 10^{16}$ cm$^{-3}$ and lower than or equal to $1 \times 10^{20}$ cm$^{-3}$, preferably higher than or equal to $1 \times 10^{17}$ cm$^{-3}$ and lower than or equal to $1 \times 10^{20}$ cm$^{-3}$.

The carrier concentration of the oxide semiconductor layer in each of the switching field-effect transistors and each of the first to third field-effect transistors is lower than $5 \times 10^{14}$/cm$^{-3}$.

The first gate or the second gate of the power MOSFET overlaps with one of the first terminal and the second terminal but does not necessarily overlap with the other of the first terminal and the second terminal.

According to one embodiment of the present invention, a power device which can realize an off state and a semiconductor device including the power device can be provided without increase in power consumption.

BEST MODE FOR CARRYING OUT THE INVENTION

Figure 1:
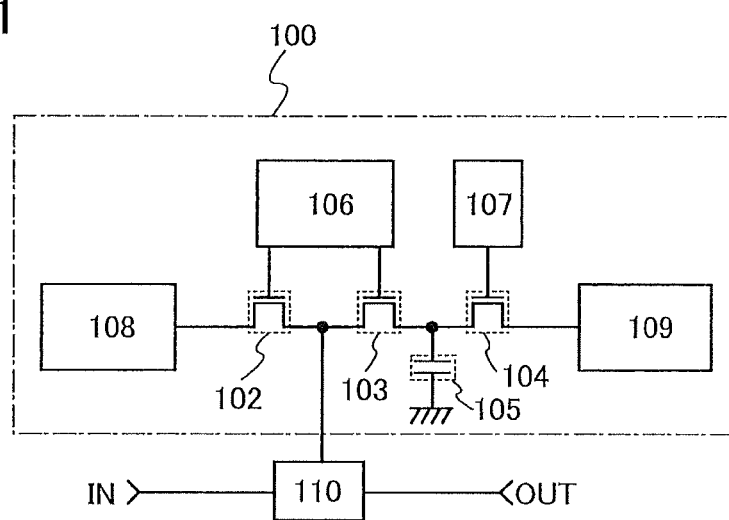
FIG. 1 is an equivalent circuit diagram illustrating a semiconductor device of one embodiment of the present invention.

Hereinafter, embodiments of the present invention will be described with reference to the accompanying drawings.

Note that the present invention can be carried out in many different modes, and it is easily understood by those skilled in the art that modes and details of the present invention can be modified in various ways without departing from the spirit and the scope of the present invention. Therefore, the present invention should not be interpreted as being limited to the description of the embodiments. Note that in structures of the present invention described below, reference numerals denoting the same portions are used in common in different drawings.

Note that the size, the thickness of a layer, and a region of each structure illustrated in the drawings and the like in the embodiments are exaggerated for simplicity in some cases. Therefore, embodiments of the present invention are not limited to such scales.

Note that terms such as first, second, third, and Nth (N is a natural number) employed in this specification are used in order to avoid confusion between components and do not set a limitation on number.

Note that voltage refers to a potential difference between a given potential and a reference potential (e.g., a ground potential) in many cases. Accordingly, voltage, potential, and a potential difference can be referred to as potential, voltage, and a voltage difference, respectively.

Note that when it is explicitly described that "A and B are connected", the case where A and B are electrically connected, the case where A and B are functionally connected, and the case where A and B are directly connected are included therein. Here, each of A and B corresponds to an object (e.g., a device, an element, a circuit, a wiring, an electrode, a terminal, a conductive layer, or a layer). Accordingly, a connection relation other than that shown in drawings and texts is also included without limitation to a predetermined connection relation, for example, the connection relation shown in the drawings and the texts.

Embodiment 1

In this embodiment, a circuit structure of a semiconductor device, which is a power device, and operation thereof will be described.

A semiconductor device illustrated in FIG. 1 includes a power element 110 and a control circuit 100. The control circuit 100 includes a field-effect transistor 102 (also referred to as a first transistor), a field-effect transistor 103 (also referred to as a second transistor), a field-effect transistor 104 (also referred to as a third transistor), a capacitor 105, an overvoltage detection circuit 106, a refresh control circuit 107, a high voltage generation source 108, and a low voltage generation source 109.

The control circuit 100 switches between high voltage generated by the high voltage generation source 108 and low voltage generated by the low voltage generation source 109, which is voltage applied to the power element 110. Moreover, the control circuit 100 controls the amount of current flowing through the power element 110 when overvoltage is applied between an input terminal IN and an output terminal OUT.

As for the field-effect transistor 102, a gate is connected to the overvoltage detection circuit 106, a first terminal is connected to the high voltage generation source 108, and a second terminal is connected to the power element 110. The field-effect transistor 102 controls application of a high potential to the power element 110 connected to the second terminal.

As for the field-effect transistor 103, a gate is connected to the overvoltage detection circuit 106, a first terminal is connected to the capacitor 105 and a second terminal of the field-effect transistor 104, and a second terminal is connected to the power element 110.

The field-effect transistor 103 controls application of a low potential stored in the capacitor 105 from the low voltage generation source 109, to the power element 110 connected to the second terminal.

Note that off-state current in this specification refers to current flowing between a source and a drain, that is, between a first terminal and a second terminal of a field-effect transistor when the field-effect transistor is not conducting.

As for the field-effect transistor 104, a gate is connected to the refresh control circuit 107, a first terminal is connected to the low voltage generation source 109, and the second terminal is connected to the capacitor 105 and the first terminal of the field-effect transistor 103. The field-effect transistor 104 controls charging of the capacitor 105 connected to the second terminal with a low potential.

A channel region of each of the field-effect transistors 102 to 104 is formed using an i-type or substantially i-type oxide semiconductor layer. The carrier density of the i-type or substantially i-type oxide semiconductor layer is lower than $5 \times 10^{14}/cm^{-3}$, preferably lower than $1 \times 10^{12}/cm^3$, more preferably lower than or equal to $1 \times 10^{11}/cm^3$. Moreover, it is preferable that hydrogen or oxygen deficiency serving as a donor be little and the hydrogen concentration be lower than or equal to $1 \times 10^{16}/cm^3$. Note that the carrier density can be obtained by the Hall effect measurement. Lower carrier density can be obtained with the use of measurement results of capacitance-voltage (CV) measurement. The hydrogen concentration of the oxide semiconductor layer can be measured by secondary ion mass spectrometry (SIMS).

The field-effect transistor 102 including the i-type or substantially i-type oxide semiconductor in a channel region can have an off-state current of $1 \times 10^{-16}$ A/μm or smaller, and further can have an off-state current of $1 \times 10^{-19}$ A/μm or smaller. An i-type or substantially i-type oxide semiconductor has a wide band gap and requires a large amount of thermal energy for excitation of electrons; therefore, direct recombination and indirect recombination are less likely to occur. In a state where a negative potential is applied to a gate electrode (an off state), holes which are minority carriers are substantially zero; accordingly, direct recombination and indirect recombination are less likely to occur and the amount of current is as small as possible. As a result, in a state where the field-effect transistor is in a non-conducting (also referred to as OFF) state, a circuit can be designed with the oxide semiconductor layer that can be considered as an insulator. On the other hand, when the field-effect transistor is in a conducting state, the current supply capability of the i-type or substantially i-type oxide semiconductor layer is expected to be higher than the current supply capability of a semiconductor layer formed of amorphous silicon. The field-effect transistors 102 to 104 are enhancement type transistors and normally-off transistors with extremely small leakage current in an off state, and thus have excellent switching characteristics.

The capacitor 105 is an element for holding a low potential to be applied to the power element 110 when the field-effect transistor 104 is intermittently conducting (also referred to as ON). The capacitor 105 may have a structure in which an insulating layer is sandwiched between conductors.

The overvoltage detection circuit 106 is a circuit for controlling conduction and non-conduction of the field-effect transistor 102 and the field-effect transistor 103 in accordance with voltage between the input terminal IN and the output terminal OUT. Specifically, when overvoltage is applied between the input terminal IN and the output terminal OUT, the field-effect transistor 102 is made to be conducting, the field-effect transistor 103 is made to be non-conducting, and application of high voltage from the high voltage generation source 108 to the power element 110 is controlled. When overvoltage is not applied between the input terminal IN and the output terminal OUT, the field-effect transistor 102 is made to be non-conducting, the field-effect transistor 103 is made to be conducting, and application of a low potential stored in the capacitor 105 from the low voltage generation source 109, to the power element 110 is controlled.

The refresh control circuit 107 is a circuit for controlling conduction and non-conduction of the field-effect transistor 104 in order to control charging of the capacitor 105 with a low potential from the low voltage generation source 109. Specifically, the refresh control circuit 107 is a circuit for intermittently making the field-effect transistor 104 conducting in order to charge the capacitor 105 with a low potential before releasing a low potential to the power element 110, which is held because of charging of the capacitor 105 from the low voltage generation source 109.

Figure 2A:
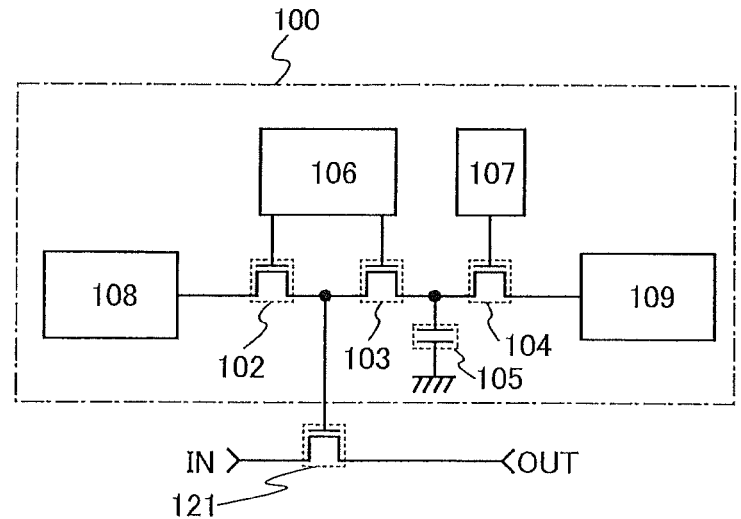
FIGS. 2A to 2C are each an equivalent circuit diagram illustrating a semiconductor device of one embodiment of the present invention.

A power element which is turned on without application of voltage to its gate is used as the power element 110. As the power element 110, a bipolar transistor, a field-effect transistor (FET), a gate turnoff thyristor, an insulated gate bipolar transistor (IGBT), or the like, which includes Si, SiC, GaN, or an oxide semiconductor, can be used as appropriate. Further, as the field-effect transistor, a power metal oxide semiconductor FET (power MOSFET), an HFET, a junction field-effect transistor (JFET), or the like can be used as appropriate. An equivalent circuit including a power element 121 having three terminals is illustrated in FIG. 2A. A gate of the power element 121 is connected to the field-effect transistor 102 and the field-effect transistor 103. Further, one of a source terminal and a drain terminal of the power element 121 is referred to as a first terminal and the other of the source terminal and the drain terminal of the power element 121 is referred to as a second terminal. The first terminal is connected to the input terminal IN and the second terminal is connected to the output terminal OUT.

Figure 2B:
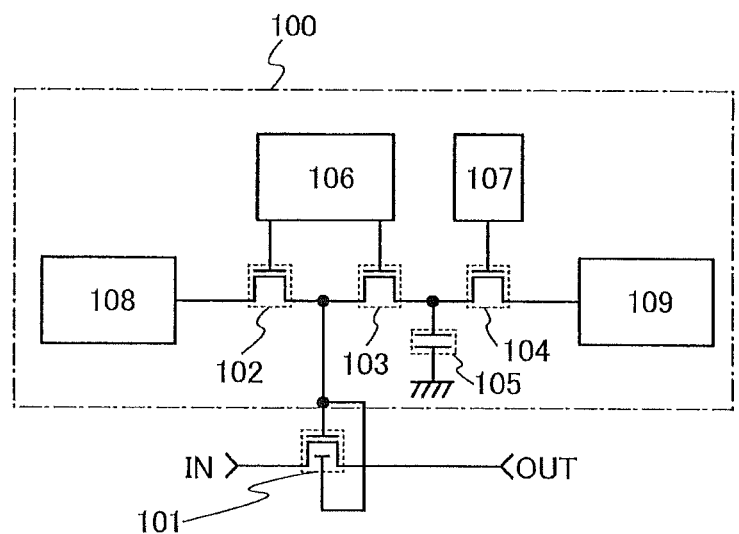

In this embodiment, hereinafter, as a typical example of the power element 110, description is given with the use of a power MOSFET 101 having four terminals as illustrated in FIG. 2B.

The power MOSFET 101 includes four terminals, which are typically a first gate terminal (also referred to as a first gate), a second gate terminal (also referred to as a second gate), a drain terminal (also referred to as a drain), and a source terminal (also referred to as a source). In the power MOSFET 101, the first gate and the second gate are provided above and below a channel region, and a signal for controlling switching of the power MOSFET 101 is supplied to the first gate and the second gate.

Figure 2C:
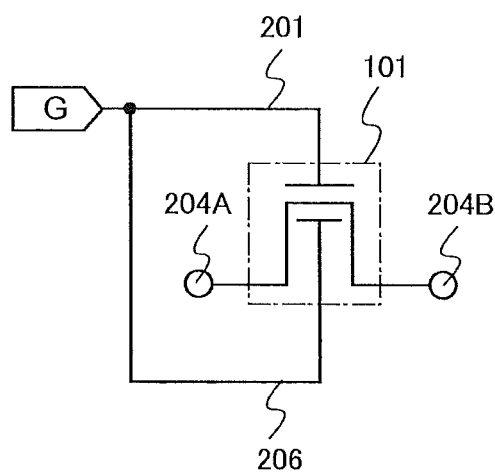

FIG. 2C is a circuit symbol of the power MOSFET 101 in which a first gate 201 and a second gate 206 are provided above and below a channel region. As illustrated in FIG. 2C, the power MOSFET 101 includes the first gate 201, the second gate 206, a first terminal 204A, and a second terminal 204B. In the power MOSFET 101, a signal (a signal G in FIG. 2C) output from the high voltage generation source 108 or the low voltage generation source 109 is input to the first gate 201 and the second gate 206. By the signal output from the high voltage generation source 108 or the low voltage generation source 109, switching of conduction and non-conduction between the first terminal 204A and the second terminal 204B of the power MOSFET 101 is controlled.

The channel region of the power MOSFET 101 may be formed using an n-type oxide semiconductor layer. The n-type oxide semiconductor layer has a carrier density of higher than or equal to $1\times10^{16}$ cm$^{-3}$ and lower than or equal to $1\times10^{20}$ cm$^{-3}$, preferably higher than or equal to $1\times10^{17}$ cm$^{-3}$ and lower than or equal to $1\times10^{20}$ cm$^{-3}$. Since hydrogen and oxygen deficiency serve as donors in an oxide semiconductor, it is preferable that the hydrogen concentration be higher than or equal to $1\times10^{16}$ cm$^{-3}$ and lower than or equal to $1\times10^{20}$ cm$^{-3}$.

Since the power MOSFET 101 includes an n-type oxide semiconductor layer in the channel region, on-resistance can be reduced and a large amount of current can flow as compared to a power MOSFET including an i-type oxide semiconductor layer in a channel region. However, since the power MOSFET including an n-type oxide semiconductor layer in a channel region is a depletion type transistor, the transistor is a normally-on transistor in which current flows even in a state where voltage is not applied to its gate. The power MOSFET described in this embodiment includes the second gate 206 in addition to the first gate 201. When negative voltage is applied to the first gate 201 and the second gate 206, the power MOSFET can be turned off. Therefore, the power MOSFET in which on-resistance is low and a large amount of current can flow can be turned off. On the other hand, when positive voltage is applied to the first gate 201 and the second gate 206, the power MOSFET can be turned on. Further, since the power MOSFET 101 includes the first gate 201 and the second gate 206, the threshold voltage can be made further negative by making the channel region thicker and on current can be increased as compared to a power MOSFET having a single gate.

Next, operation of the semiconductor device illustrated in FIG. 2B will be described with reference to FIGS. 3A to 3C and FIGS. 4A and 4B. In FIGS. 3A to 3C and FIGS. 4A and 4B, dotted arrows are shown to facilitate understanding of flow of signals in accordance with conduction and non-conduction of the power MOSFET 101 and the field-effect transistors. The channel region of the power MOSFET 101 included in a semiconductor device is formed using an n-type oxide semiconductor layer, and the power MOSFET 101 is made to be conducting by the high potential from the high voltage generation source 108 and is made to be non-conducting by the low potential from the low voltage generation source 109. Note that as for operation of the semiconductor device illustrated in FIG. 2A, the power MOSFET 101 in the equivalent circuits illustrated in FIGS. 3A to 3C and FIGS. 4A and 4B may be replaced with the power element 121.

Figure 3A:
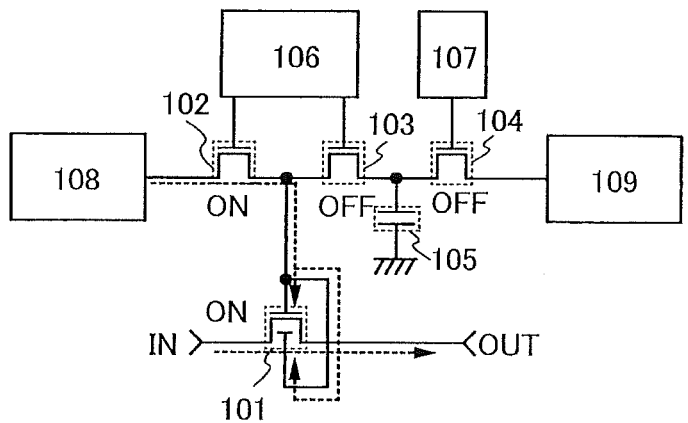
FIGS. 3A to 3C are each an equivalent circuit diagram illustrating a semiconductor device of one embodiment of the present invention.

Operation in the case where the power MOSFET 101 is conducting will be described with reference to FIG. 3A. The field-effect transistor 102 is made to be conducting by control of the overvoltage detection circuit 106, the field-effect transistor 103 is made to be non-conducting by control of the overvoltage detection circuit 106, and the field-effect transistor 104 is made to be non-conducting by control of the refresh control circuit 107. The field-effect transistor 102 is made to be conducting, so that a high potential is applied to the first gate and the second gate of the power MOSFET 101 from the high voltage generation source 108 and thus the power MOSFET 101 is conducting.

Figure 3B:
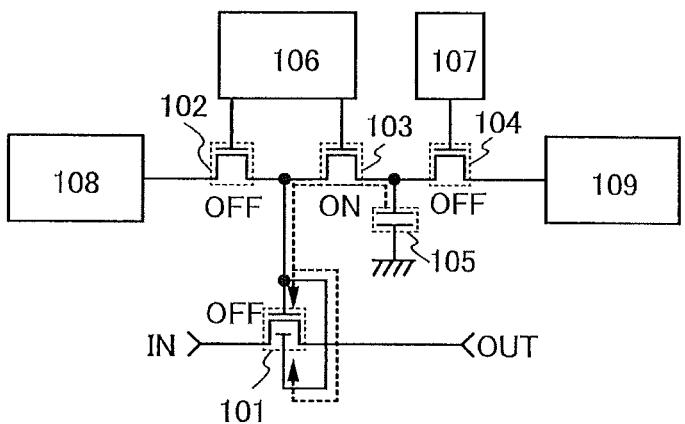

Operation in the case where the power MOSFET 101 is non-conducting will be described with reference to FIG. 3B. The field-effect transistor 102 is made to be non-conducting by control of the overvoltage detection circuit 106, the field-effect transistor 103 is made to be conducting by control of the overvoltage detection circuit 106, and the field-effect transistor 104 is made to be non-conducting by control of the refresh control circuit 107. As illustrated in FIG. 3B, the field-effect transistor 103 is conducting, so that a low potential which is stored in the capacitor 105 from the low voltage generation source 109 is applied to the first gate and the second gate of the power MOSFET 101 and thus the power MOSFET 101 is non-conducting.

Operation in the case where the capacitor 105 is charged with a low potential described with reference to FIG. 3B will be described with reference to FIG. 3C. The field-effect transistor 102 is made to be non-conducting by control of the overvoltage detection circuit 106, the field-effect transistor 103 is made to be conducting by control of the overvoltage detection circuit 106, and the field-effect transistor 104 is made to be conducting by control of the refresh control circuit 107. A low potential is stored in the capacitor 105 from the low voltage generation source 109.

Figure 3C:
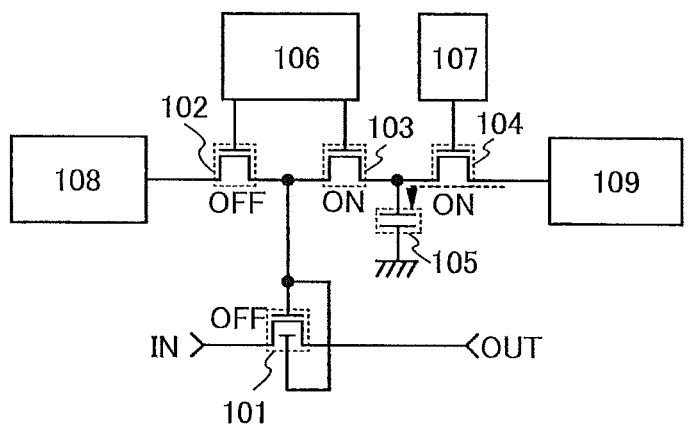

Note that charge of the capacitor 105 with a low potential, which is described with reference to FIG. 3C, is performed at regular intervals controlled by the refresh control circuit 107. Specifically, the semiconductor device keeps the state illustrated in FIG. 3B while a low potential making the power MOSFET 101 non-conducting, with which the capacitor 105 is charged by the low voltage generation source 109, is held in the capacitor 105. Then, the semiconductor device is made to be in a state illustrated in FIG. 3C in an intermittent manner; thus, the field-effect transistor 104 is made to be conducting and a low potential is stored in the capacitor 105. For example, the operation illustrated in FIG. 3C may be performed once a minute, with enough time taken for charging.

In the structure of this embodiment as described above, the state in FIG. 3A or FIG. 3B and the state in FIG. 3C are repeated, but a period in which the state in FIG. 3B is held is longer.

Figure 4A:
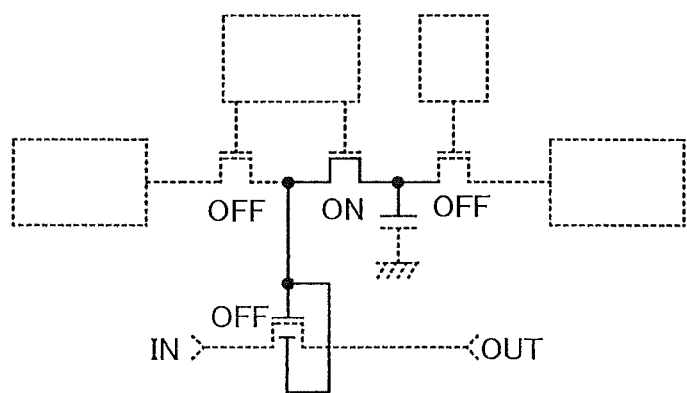
FIGS. 4A and 4B are each an equivalent circuit diagram illustrating a semiconductor device of one embodiment of the present invention.

Here, an effect of this embodiment will be described in detail with reference to FIG. 4A. In FIG. 4A, a node connected to the first gate and the second gate of the power MOSFET 101, the field-effect transistor 103, and one of the terminals of the capacitor 105, which are in a state illustrated in FIG. 3B, are illustrated with solid lines and other connections are illustrated by dotted lines.

The field-effect transistor 102 and the field-effect transistor 104 become non-conducting, whereby the node connected to the first gate and the second gate of the power MOSFET 101 is electrically in a floating state. As described above, each of the field-effect transistor 102 and the field-effect transistor 104 includes an i-type or substantially i-type oxide semiconductor layer in the channel region, so that off-state current is extremely small. Therefore, the node connected to the first gate and the second gate of the power MOSFET 101 can hold a low potential stored in the capacitor 105 from the low voltage generation source 109 for a long time. A low potential may be applied to the capacitor not constantly but intermittently. Further, when a low potential is applied to the first gate and the second gate of the power MOSFET 101, the power MOSFET 101 is in an off state. Therefore, the semiconductor device of this embodiment can realize an off state of the power MOSFET 101 without increase in power consumption.

Figure 4B:
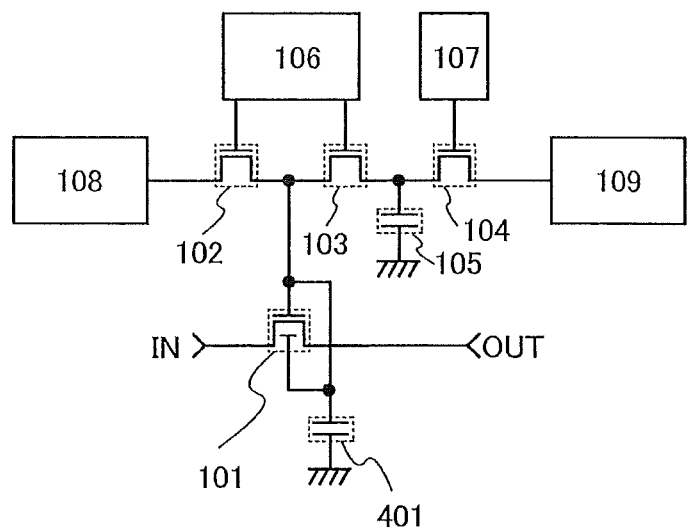

Further, in the semiconductor device illustrated in FIG. 2C, in order to increase a holding property of a potential of the node connected to the first gate and the second gate of the power MOSFET 101, a capacitor 401 may be additionally provided to the node connected to the first gate and the second gate as illustrated in FIG. 4B. Note that in the semiconductor devices illustrated in FIGS. 2A and 2B, the capacitor 401 may be provided to the gate of the power MOSFET 101 or the gate of the power element 121.

Note that in this embodiment, what is illustrated in the drawing can be freely combined with or replaced with what is described in another embodiment as appropriate.

Embodiment 2

In this embodiment, a structure of the power MOSFET 101 described in Embodiment 1 and a manufacturing method thereof will be described with reference to FIGS. 5A and 5B, FIGS. 6A and 6B, and FIGS. 7A to 7D.

Figure 5A:
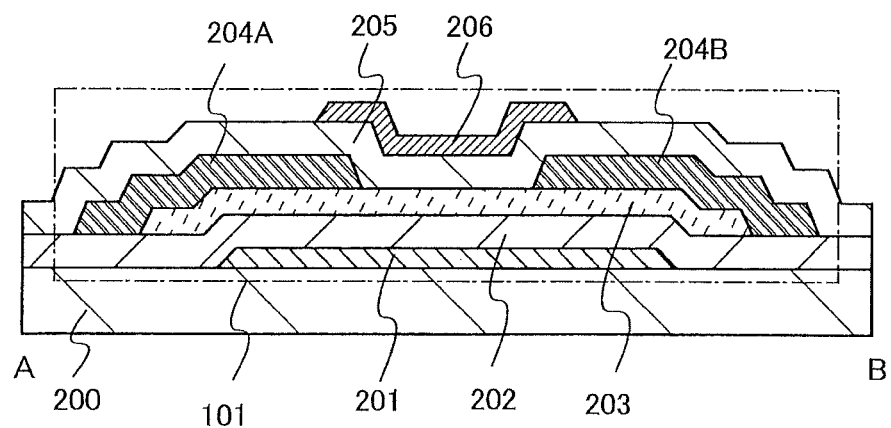
FIGS. 5A and 5B are a cross-sectional view and a top view illustrating a semiconductor device of one embodiment of the present invention.
Figure 5B:
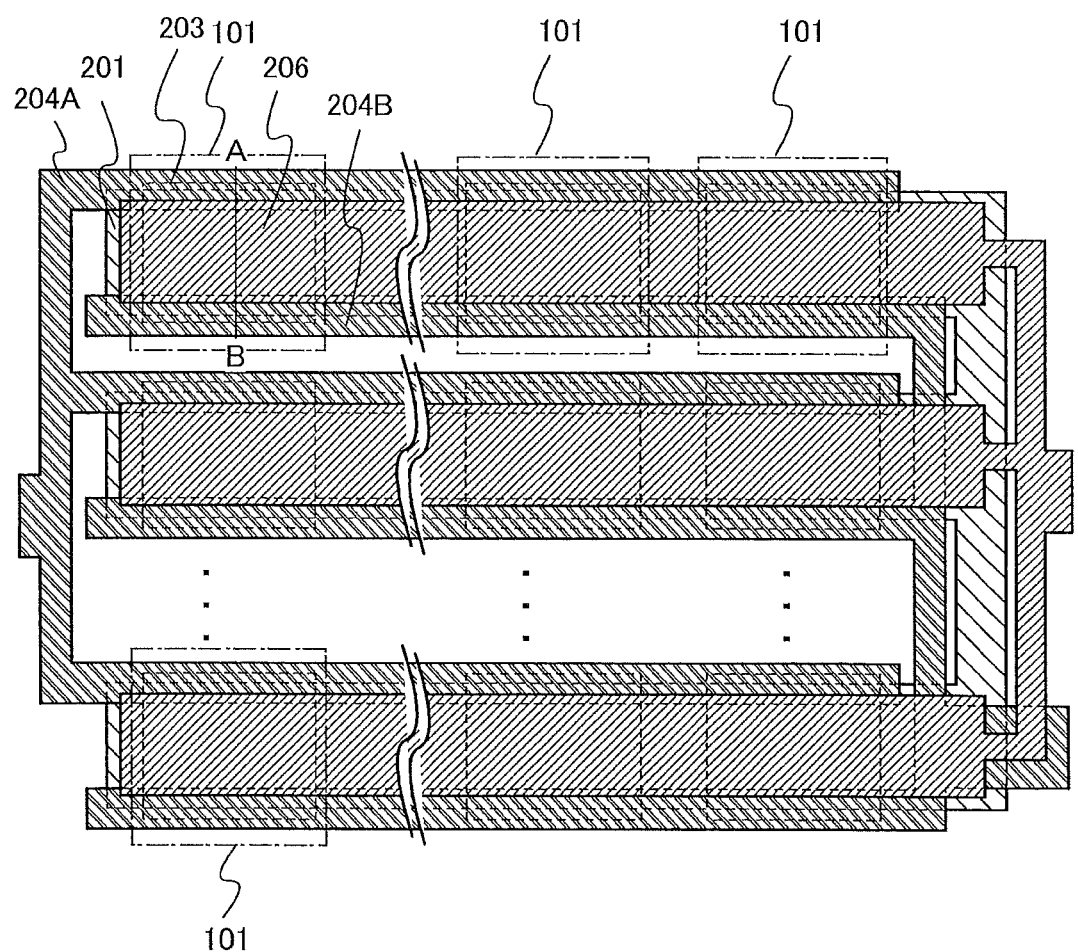

FIG. 5A illustrates one embodiment of a cross-sectional structure of the power MOSFET 101 described in Embodiment 1 and FIG. 5B illustrates a top view of the power MOSFET 101. A cross-sectional view taken along line A-B in FIG. 5B corresponds to FIG. 5A.

In the power MOSFET 101 illustrated in FIG. 5A, the first gate 201 formed of a conductive layer is provided over a substrate 200, a gate insulating layer 202 is provided over the first gate 201, an n-type oxide semiconductor layer 203 is provided over the gate insulating layer 202, the first terminal 204A and the second terminal 204B formed of a conductive layer are provided so as to cover part of the oxide semiconductor layer 203, an insulating layer 205 is provided so as to cover the oxide semiconductor layer 203, the first terminal 204A, and the second terminal 204B, and the second gate 206 formed of a conductive layer is provided over the insulating layer 205 so as to overlap with part of the first terminal 204A and part of the second terminal 204B.

It is necessary that the substrate 200 have at least heat resistance high enough to withstand heat treatment performed later. When a glass substrate is used as the substrate 200, a glass substrate having a strain point of higher than or equal to 730° C. is preferably used. As the glass substrate, a glass material such as aluminosilicate glass, aluminoborosilicate glass, or barium borosilicate glass is used, for example. Note that a glass substrate containing BaO and $B_2O_3$ so that the amount of BaO is larger than that of $B_2O_3$ is preferably used.

Instead of the glass substrate, a substrate formed of an insulator, such as a ceramic substrate, a quartz substrate, or a sapphire substrate can be used. Alternatively, crystallized glass or the like may be used. Further alternatively, a substrate obtained by forming an insulating layer over a surface of a semiconductor substrate such as a silicon wafer or a surface of a conductive substrate formed of a metal material can be used.

Although not illustrated in FIG. 5A, when an insulating layer having high thermal conductivity is formed between the substrate 200 and the first gate 201, the power MOSFET 101 having high heat resistance can be manufactured. Examples of the insulating layer having high thermal conductivity include an aluminum nitride layer, an aluminum nitride oxide layer, a silicon nitride layer, and the like.

The first gate 201 is formed using a metal element selected from aluminum, chromium, copper, tantalum, titanium, molybdenum, and tungsten; an alloy containing any of these metal elements as a component; an alloy containing these metal elements in combination; or the like. Further, one or more metal elements selected from manganese, magnesium, zirconium, and beryllium may be used. In addition, the first gate 201 may have a single-layer structure or a stacked structure having two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, a three-layer structure in which a titanium layer, an aluminum layer, and a titanium layer are stacked in this order, and the like can be given. Alternatively, a layer, an alloy layer, or a nitride layer, which contains aluminum and one or more elements selected from titanium, tantalum, tungsten, molybdenum, chromium, neodymium, and scandium, thereof may be used.

The first gate 201 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

The gate insulating layer 202 can be formed in a single layer or a stacked layer using a silicon oxide layer, a silicon nitride layer, a silicon oxynitride layer, a silicon nitride oxide layer, or an aluminum oxide layer. A portion of the gate insulating layer 202 which is in contact with the oxide semiconductor layer 203 preferably contains oxygen, and in particular, the portion of the gate insulating layer 202 is preferably formed using a silicon oxide layer. By using a silicon oxide layer, oxygen can be supplied to the oxide semiconductor layer 203 and favorable characteristics can be obtained.

The gate insulating layer 202 is formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current can be reduced. Further, a stacked structure can be used in which a high-k material and one or more of a silicon oxide layer, a silicon nitride layer, a silicon oxynitride layer, a silicon nitride oxide layer, and an aluminum oxide layer are stacked. The thickness of the gate insulating layer 202 can be greater than or equal to 100 nm and less than or equal to 300 nm.

As the n-type oxide semiconductor layer 203, a four-component metal oxide such as an In—Sn—Ga—Zn—O-based metal oxide, a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide, a two-component metal oxide such as an In—Zn—O-based metal oxide, a Sn—Zn—O-based metal oxide, an Al—Zn—O-based metal oxide, a Zn—Mg—O-based metal oxide, a Sn—Mg—O-based metal oxide, or an In—Mg—O-based metal oxide can be used. Here, an n-component metal oxide includes n kinds of metal oxides. Note that as an impurity, the oxide semiconductor layer may include an element other than the metal oxide of main component at 1%, preferably at 0.1%.

The n-type oxide semiconductor layer 203 is formed of a three-component metal oxide, and may be formed of a metal oxide expressed by $InM_XZn_YO_Z$ (Y=0.5 to 5). Here, M represents one or a plurality of elements selected from Group 13, such as gallium (Ga), aluminum (Al), or boron (B). Note that the contents of In, M, Zn, and O can be set freely, and the case where the M content is zero (that is, X=0) is included. On the other hand, the contents of In and Zn are not zero. In other words, the above expression may represent an In—Ga—Zn—O-based metal oxide, an In—Zn—O-based metal oxide semiconductor, and the like.

Further, it is preferable that the energy gap of the metal oxide forming the n-type oxide semiconductor layer 203 be 2 eV or more, preferably 2.5 eV or more, more preferably 3 eV or more.

As the n-type oxide semiconductor layer 203, an oxide semiconductor having an amorphous structure, a microcrystalline structure, a polycrystalline structure, or a single crystal structure can be used as appropriate. Further, an oxide semiconductor having a crystal in which the c-axis is approximately parallel to a direction perpendicular to a surface can be used.

The n-type oxide semiconductor layer 203 has a carrier density of higher than or equal to $1 \times 10^{16}$ cm$^{-3}$ and lower than or equal to $1 \times 10^{20}$ cm$^{-3}$, preferably higher than or equal to $1 \times 10^{17}$ cm$^{-3}$ and lower than or equal to $1 \times 10^{20}$ cm$^{-3}$. Since hydrogen and oxygen deficiency serve as donors in an oxide semiconductor, it is preferable that the hydrogen concentration be higher than or equal to $1 \times 10^{16}$ cm$^{-3}$ and lower than or equal to $1 \times 10^{20}$ cm$^{-3}$.

The thickness of the n-type oxide semiconductor layer 203 is set so that a depletion layer spreads in a channel region and the power MOSFET 101 is turned off when negative voltage is applied to the first gate and the second gate. In the case where the carrier density is higher than or equal to $1 \times 10^{16}$ cm$^{-3}$ and lower than or equal to $1 \times 10^{20}$ cm$^{-3}$, the dielectric constant is 15, the band gap is 3.15, the effective density of states in the conduction band is Nc=$2.8 \times 10^{19}$ cm$^{-3}$, the effective density of states in the valence band is Nv=$1.04 \times 10^{19}$ cm$^{-3}$, and a gate is provided on one surface side of the oxide semiconductor layer, the maximum width of the depletion layer is greater than or equal to 7 nm and less than or equal to 677 nm. Since the power MOSFET illustrated in FIG. 5A includes the first gate 201 and the second gate 206, the thickness of the n-type oxide semiconductor layer 203 can be set to greater than or equal to 14 nm and less than or equal to 1354 nm. Further, in the case where the carrier density is higher than or equal to $1 \times 10^{17}$ cm$^{-3}$ and lower than or equal to $1 \times 10^{20}$ cm$^{-3}$, the maximum width of the depletion layer is greater than or equal to 7 nm and less than or equal to 218 nm. In this case, the thickness of the n-type oxide semiconductor layer 203 can be set to greater than or equal to 14 nm and less than or equal to 436 nm.

The first terminal 204A and the second terminal 204B are formed using a metal element selected from aluminum, chromium, copper, tantalum, titanium, molybdenum, and tungsten; an alloy containing any of these metal elements as a component; an alloy containing these metal elements in combination; or the like. Further, one or more metal elements selected from manganese, magnesium, zirconium, and beryllium may be used. In addition, the first terminal 204A and the second terminal 204B may have a single-layer structure or a stacked structure having two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, a three-layer structure in which a titanium layer, an aluminum layer, and a titanium layer are stacked in this order, and the like can be given. Alternatively, a layer, an alloy layer, or a nitride layer, which contains aluminum and one or more elements selected from titanium, tantalum, tungsten, molybdenum, chromium, neodymium, and scandium may be used.

The first terminal 204A and the second terminal 204B can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

The insulating layer 205 can be formed using the material of the gate insulating layer 202 as appropriate.

The second gate 206 can be formed using the material of the first gate 201 as appropriate.

Since the power MOSFET 101 illustrated in FIGS. 5A and 5B includes an n-type oxide semiconductor layer in the channel region, on-resistance can be reduced and a large amount of current can flow. However, since the power MOSFET including an n-type oxide semiconductor layer in a channel region is a depletion type transistor, the transistor is a normally-on transistor in which current flows even in a state where voltage is not applied to its gate. The power MOSFET described in this embodiment includes the second gate 206 in addition to the first gate 201. When negative voltage is applied to the first gate 201 and the second gate 206, the power MOSFET can be turned off. Therefore, the power MOSFET in which on-resistance is low and a large amount of current can flow can be turned off. On the other hand, when positive voltage is applied to the first gate 201 and the second gate 206, the power MOSFET can be turned on. Further, since the power MOSFET 101 includes the first gate 201 and the second gate 206, the channel region can be made thicker and on current can be increased as compared to a power MOSFET having a single gate.

As illustrated in FIG. 5B, the power MOSFETs 101 are connected in parallel, so that the channel width W can be made wide. Accordingly, a power device through which a large amount of current can flow can be manufactured.

Figure 6A:
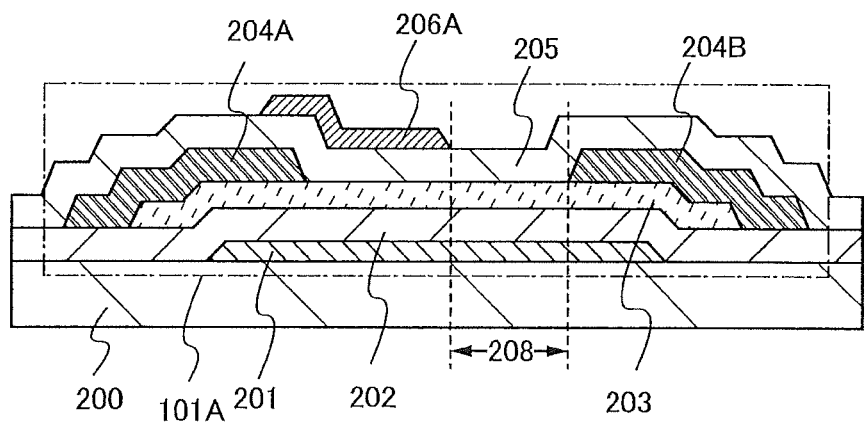
FIGS. 6A and 6B are each a cross-sectional view illustrating a semiconductor device of one embodiment of the present invention.
Figure 6B:
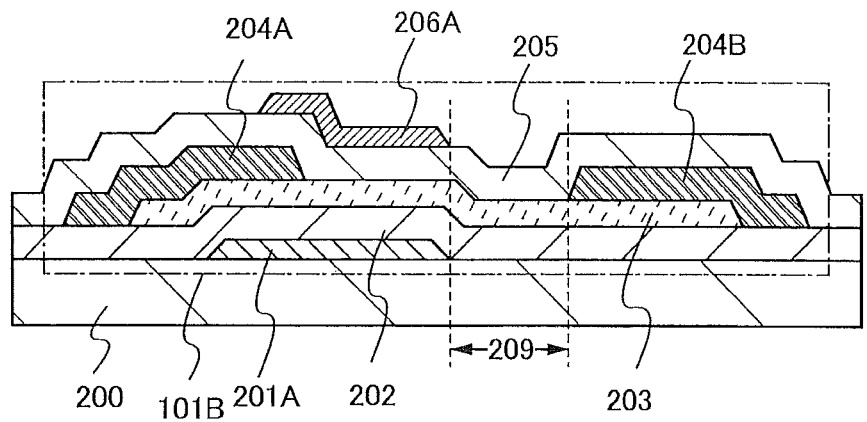

Next, cross-sectional structures of a power MOSFET, which are different from the structure in FIGS. 5A and 5B, are illustrated in FIGS. 6A and 6B. In a power MOSFET 101A illustrated in FIG. 6A, a second gate 206A overlaps with one of the first terminal 204A and the second terminal 204B and does not overlap with the other.

In the power MOSFET 101A illustrated in FIG. 6A, the first gate 201 formed of a conductive layer is provided over the substrate 200, the gate insulating layer 202 is provided over the first gate 201, the n-type oxide semiconductor layer 203 is provided over the gate insulating layer 202, the first terminal 204A and the second terminal 204B formed of a conductive layer are provided so as to cover part of the oxide semiconductor layer 203, and the insulating layer 205 is provided so as to cover the oxide semiconductor layer 203, the first terminal 204A, and the second terminal 204B. Further, the second gate 206A formed of a conductive layer is provided over the insulating layer 205 so as to overlap with one of the first terminal 204A and the second terminal 204B and so as not to overlap with the other. That is, a region 208 is provided so that the oxide semiconductor layer 203 is overlapped with none of the second gate 206A, the first terminal 204A, and the second terminal 204B in the region 208.

The second gate 206A can be formed using the material and the method similar to those of the second gate 206 illustrated in FIGS. 5A and 5B.

In a power MOSFET 101B illustrated in FIG. 6B, a first gate 201A formed of a conductive layer is provided over the substrate 200, the gate insulating layer 202 is provided over the first gate 201A, the n-type oxide semiconductor layer 203 is provided over the gate insulating layer 202, the first terminal 204A and the second terminal 204B formed of a conductive layer are provided so as to cover part of the oxide semiconductor layer 203, and the insulating layer 205 is provided so as to cover the oxide semiconductor layer 203, the first terminal 204A, and the second terminal 204B. Further, the second gate 206A formed of a conductive layer is provided over the insulating layer 205 so as to overlap with one of the first terminal 204A and the second terminal 204B and so as not to overlap with the other. That is, an offset region 209 is provided so that the oxide semiconductor layer 203 is overlapped with none of the first gate 201A, the second gate 206A, the first terminal 204A, and the second terminal 204B in the offset region 209.

The first gate 201A can be formed using the material and the method similar to those of the first gate 201 illustrated in FIGS. 5A and 5B.

Since the power MOSFET 101A and the power MOSFET 101B illustrated in FIGS. 6A and 6B each includes the n-type oxide semiconductor layer 203 in the channel region, on-resistance can be reduced and a large amount of current can flow. However, since the power MOSFET including an n-type oxide semiconductor layer in a channel region is a depletion transistor, the transistor is a normally-on transistor in which current flows even in a state where voltage is not applied to its gate. The power MOSFET described in this embodiment includes the second gate 206A in addition to the first gate 201 or the first gate 201A. When negative voltage is applied to either the first gate 201 or the first gate 201A and the second gate 206A, the power MOSFET can be turned off. Therefore, the power MOSFET in which on-resistance is low and a large amount of current can flow can be turned off. On the other hand, when positive voltage is applied to either the first gate 201 or the first gate 201A and the second gate 206A, the power MOSFET can be turned on. Further, since the power MOSFET includes either the first gate 201 or the first gate 201A and the second gate 206A, the channel region can be made thicker and a large amount of current can flow as compared to a power MOSFET having a single gate. Furthermore, in the power MOSFET 101B illustrated in FIG. 6B, the n-type oxide semiconductor has the offset region 209 which is not covered with the first gate 201A, the second gate 206A, the first terminal 204A, and the second terminal 204B, so that the drain breakdown voltage can be increased as compared to the power MOSFET 101 illustrated in FIG. 5A, and high voltage can be applied to the first terminal 204A or the second terminal 204B.

Here, a method for manufacturing the power MOSFET 101 illustrated in FIGS. 5A and 5B will be described with reference to FIGS. 7A to 7D.

Figure 7A:
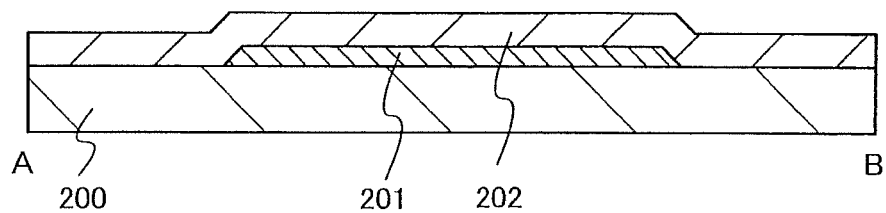
FIGS. 7A to 7D are cross-sectional views illustrating manufacturing steps of a semiconductor device of one embodiment of the present invention.

As illustrated in FIG. 7A, the first gate 201 is formed over the substrate 200. Next, the gate insulating layer 202 is formed over the first gate 201.

When the first gate 201 is formed by a printing method, an inkjet method, or the like, the number of steps can be reduced. Alternatively, the first gate 201 can be formed in such a manner that a conductive layer is formed by a sputtering method, a CVD method, an evaporation method, or the like, and then the conductive layer is etched with the use of a resist formed in a photolithography step as a mask. Note that it is preferable that an end portion of the first gate 201 be tapered because coverage with an insulating layer, a semiconductor layer, and a conductive layer which are to be formed later can be improved. Further, an insulating layer having high thermal conductivity is preferably formed between the substrate 200 and the first gate 201 by a sputtering method, a CVD method, a coating method, a printing method, or the like.

The gate insulating layer 202 can be formed by a sputtering method, a CVD method, a printing method, a coating method, or the like. Alternatively, the dense and high-quality gate insulating layer 202 having high withstand voltage can be formed by high-density plasma CVD using a microwave (e.g., a frequency of 2.45 GHz), for example. When an oxide semiconductor layer and a high-quality gate insulating layer are in close contact with each other, the interface state density can be reduced and favorable interface characteristics can be obtained. In addition, since the gate insulating layer 202 formed by the high-density plasma CVD can have a uniform thickness, the gate insulating layer 202 has excellent step coverage. Further, the thickness of the gate insulating layer 202 formed by the high-density plasma CVD can be controlled precisely.

Figure 7B:
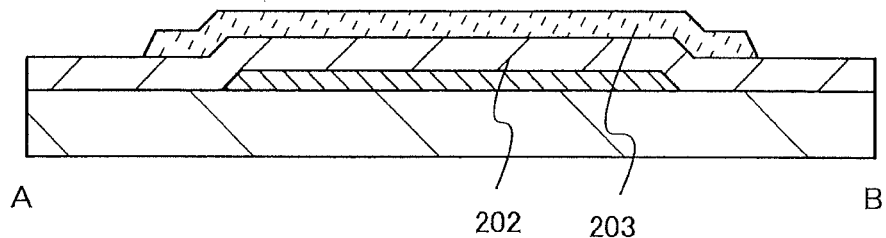

Next, as illustrated in FIG. 7B, the n-type oxide semiconductor layer 203 is formed over the gate insulating layer 202. When the n-type oxide semiconductor layer 203 is formed by a printing method, an inkjet method, or the like, the number of steps can be reduced. Alternatively, the n-type oxide semiconductor layer 203 having an island shape can be formed in such a manner that an n-type oxide semiconductor layer is formed over the gate insulating layer 202 by a sputtering method, a CVD method, a coating method, a pulsed laser deposition method, or the like, and then the oxide semiconductor layer is etched with the use of a resist formed in a photolithography step as a mask.

The carrier density of an oxide semiconductor layer depends on a deposition condition such as the hydrogen concentration and the oxygen concentration of a source gas and a target, a material for deposition, or composition of the material. When the hydrogen concentration of the oxide semiconductor layer is increased, or the oxygen concentration of the oxide semiconductor layer is reduced and oxygen deficiency is included, hydrogen or oxygen deficiency serving as a donor can be included in the oxide semiconductor layer and thus an n-type oxide semiconductor layer can be formed.

Note that after formation of the oxide semiconductor layer 203, heat treatment may be performed so that the oxide semiconductor layer has a microcrystalline structure, a polycrystalline structure, or a single crystal structure. Further, an oxide semiconductor having a crystal structure with a crystal in which the c-axis is approximately parallel to a direction perpendicular to a surface can be used.

Figure 7C:
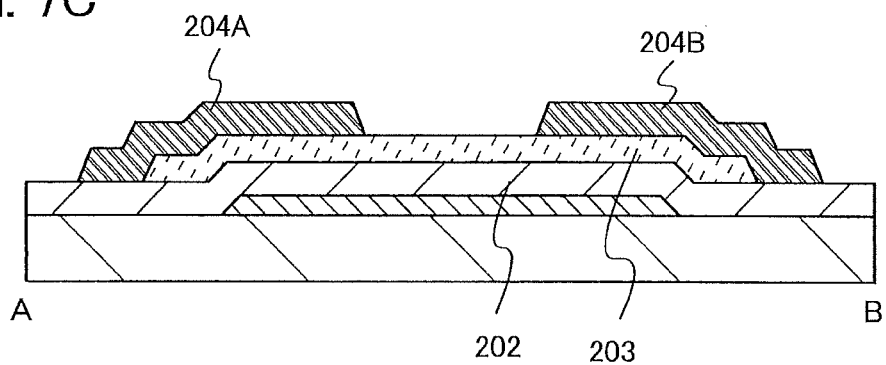

Next, as illustrated in FIG. 7C, the first terminal 204A and the second terminal 204B serving as a source electrode and a drain electrode are formed. When the first terminal 204A and the second terminal 204B are formed by a printing method, an inkjet method, or the like, the number of steps can be reduced. Alternatively, the first terminal 204A and the second terminal 204B can be formed in such a manner that a conductive layer is formed over the gate insulating layer 202 and the oxide semiconductor layer 203 by a sputtering method, a CVD method, an evaporation method, or the like, and then the conductive layer is etched with the use of a resist formed in a photolithography method as a mask.

Figure 7D:
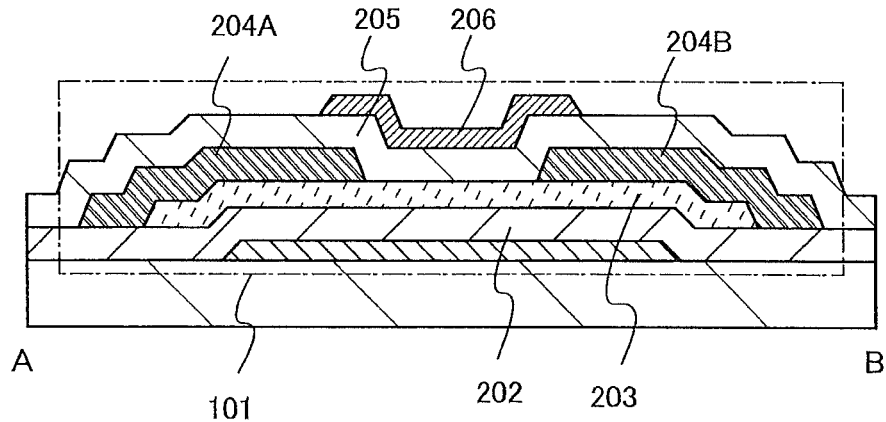

Next, as illustrated in FIG. 7D, the insulating layer 205 is formed over the gate insulating layer 202, the oxide semiconductor layer 203, the first terminal 204A, and the second terminal 204B. The insulating layer 205 can be formed in a manner similar to that of the gate insulating layer 202. Next, the second gate 206 is formed over the insulating layer 205. The second gate 206 can be formed in a manner similar to that of the first gate.

Through the above steps, the depletion type power MOSFET 101 including an n-type oxide semiconductor layer in the channel region can be manufactured. Note that in the above manufacturing steps, a layout of the second gate is changed, so that the power MOSFET 101A illustrated in FIG. 6A or the power MOSFET 101B illustrated in FIG. 6B can be manufactured.

Embodiment 3

In this embodiment, a structure of a power MOSFET which can be used instead of the power MOSFET 101 described in Embodiment 1 and Embodiment 2 will be described with reference to FIG. 8 and FIGS. 9A and 9B.

Figure 8:
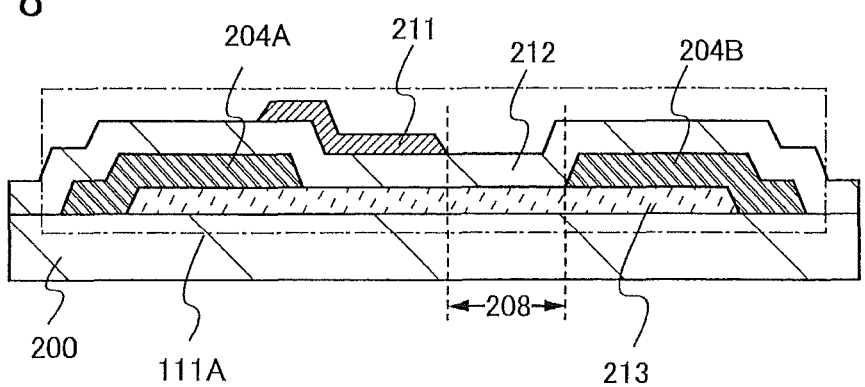
FIG. 8 is a cross-sectional view illustrating a semiconductor device of one embodiment of the present invention.
Figure 9A:
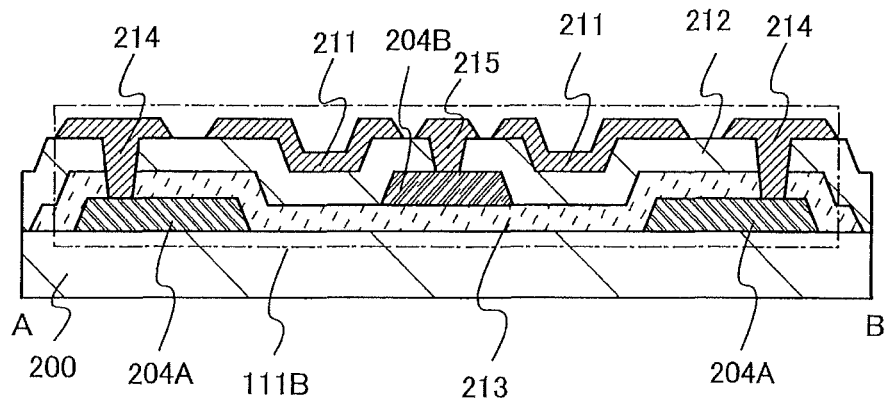
FIGS. 9A and 9B are a cross-sectional view and a top view illustrating a semiconductor device of one embodiment of the present invention.
Figure 9B:
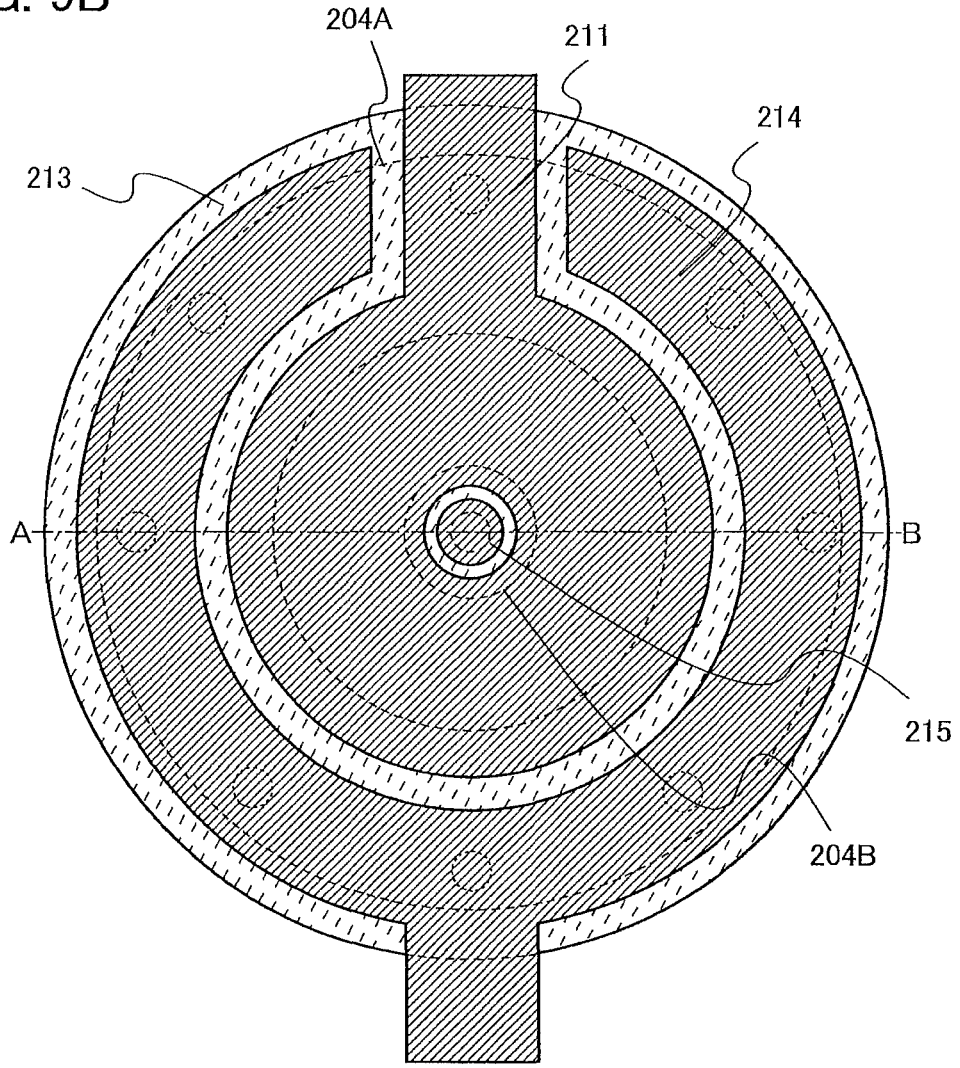

Power MOSFETs illustrated in FIG. 8 and FIGS. 9A and 9B are different from the power MOSFETs illustrated in FIGS. 6A and 6B in that a gate is not provided between the substrate 200 and an oxide semiconductor layer 213.

In a power MOSFET 111A illustrated in FIG. 8, the n-type oxide semiconductor layer 213 is provided over the substrate 200, the first terminal 204A and the second terminal 204B formed of a conductive layer is provided so as to cover part of the oxide semiconductor layer 213, a gate insulating layer 212 is provided so as to cover the oxide semiconductor layer 213, the first terminal 204A, and the second terminal 204B, and a gate 211 formed of a conductive layer is provided over the gate insulating layer 212 so as to overlap with part of one of the first terminal 204A and the second terminal 204B. That is, a region 208 is provided so that the oxide semiconductor layer 213 is overlapped with none of the gate 211, the first terminal 204A, and the second terminal 204B in the region 208.

Note that as in the power MOSFET 101 described in Embodiment 2, when an insulating layer having high thermal conductivity is formed between the substrate 200 and the oxide semiconductor layer 213, the power MOSFET 111A having high heat resistance can be manufactured. Further, the first terminal 204A and the second terminal 204B may be provided between the substrate 200 and the oxide semiconductor layer 213. Furthermore, the region 208 may not be provided and the gate 211 may be provided so as to overlap with part of the first terminal 204A and part of the second terminal 204B as in FIG. 5A.

In a power MOSFET 111B illustrated in FIG. 9A, the first terminal 204A formed of a conductive layer is provided over the substrate 200, the n-type oxide semiconductor layer 213 is provided so as to cover the first terminal 204A formed of the conductive layer, the second terminal 204B formed of a conductive layer is provided so as to cover part of the oxide semiconductor layer 213, the gate insulating layer 212 is provided so as to cover the oxide semiconductor layer 213 and the second terminal 204B, and the gate 211 formed of a conductive layer, a wiring 214 connected to the first terminal 204A, and a wiring 215 connected to the second terminal 204B are provided over the gate insulating layer 212.

FIG. 9B is a top view of the power MOSFET 111B illustrated in FIG. 9A. A cross-sectional view taken along line A-B in FIG. 9B corresponds to FIG. 9A. As illustrated in FIG. 9B, the gate 211 is provided in the periphery of the second terminal 204B and the wiring 215 connected to the second terminal 204B. Further, the first terminal 204A and the wiring 214 connected to the first terminal 204A are provided in the periphery of the gate 211.

That is, the first terminal 204A and the second terminal 204B do not overlap with each other. The gate 211 is provided over a region including a region which overlaps with neither the first terminal 204A nor the second terminal 204B. Further, part (an end portion) of the gate 211 may overlap with one or both of the first terminal 204A and the second terminal 204B.

Note that as in the power MOSFET 101 described in Embodiment 2, when an insulating layer having high thermal conductivity is formed between the substrate 200, and the first terminal 204A and the oxide semiconductor layer 213, the power MOSFET 111B having high heat resistance can be manufactured.

The oxide semiconductor layer 213 illustrated in FIG. 8 and FIGS. 9A and 9B can be formed using a material similar to the oxide semiconductor layer 203 described in Embodiment 2. Note that in the power MOSFET 111A illustrated in FIG. 8 and the power MOSFET 111B illustrated in FIGS. 9A and 9B, the gate 211 is formed on only one surface side of the oxide semiconductor layer 213. Therefore, the thickness of the oxide semiconductor layer 213 is set so that a depletion layer spreads in the channel region and the power MOSFET 111B can be turned off when negative voltage is applied to the gate 211. Since the number of gates in this embodiment is half of the number of gates of the power MOSFET 101 described in Embodiment 2, the maximum width of the depletion layer is greater than or equal to 7 nm and less than or equal to 677 nm in the case where the carrier density is higher than or equal to $1 \times 10^{16}$ cm$^{-3}$ and lower than or equal to $1 \times 10^{20}$ cm$^{-3}$. Therefore, the thickness of the n-type oxide semiconductor layer 213 can be set to greater than or equal to 7 nm and less than or equal to 677 nm. Further, the maximum width of the depletion layer is greater than or equal to 7 nm and less than or equal to 218 nm in the case where the carrier density is higher than or equal to $1 \times 10^{17}$ cm$^{-3}$ and lower than or equal to $1 \times 10^{20}$ cm$^{-3}$. In that case, the thickness of the n-type oxide semiconductor layer 213 can be set to greater than or equal to 7 nm and less than or equal to 218 nm.

Note that as methods for manufacturing the power MOSFETs illustrated in FIG. 8 and FIGS. 9A and 9B, the methods for manufacturing the power MOSFETs described in Embodiment 2 can be used as appropriate in accordance with the structures illustrated in FIG. 8 and FIGS. 9A and 9B.

Since each of the power MOSFETs illustrated in FIG. 8 and FIGS. 9A and 9B includes an n-type oxide semiconductor layer in the channel region, on-resistance can be reduced and a large amount of current can flow. However, since the power MOSFET including an n-type oxide semiconductor layer in a channel region is a depletion type transistor, the transistor is a normally-on transistor in which current flows even in a state where voltage is not applied to its gate. The power MOSFETs described in this embodiment can be turned off when negative voltage is applied to the gate 211 and can be turned on when positive voltage is applied to the gate 211. Therefore, the power MOSFET in which on-resistance is low and a large amount of current can flow can be turned off.

Embodiment 4

In this embodiment, a method for manufacturing the field-effect transistors 102 to 104 described in Embodiment 1 will be described with reference to FIG. 10 and FIGS. 11A to 11D. Since all the field-effect transistors 102 to 104 can have the same structure, here, a description is given on the field-effect transistor 102 as an example.

Figure 10:
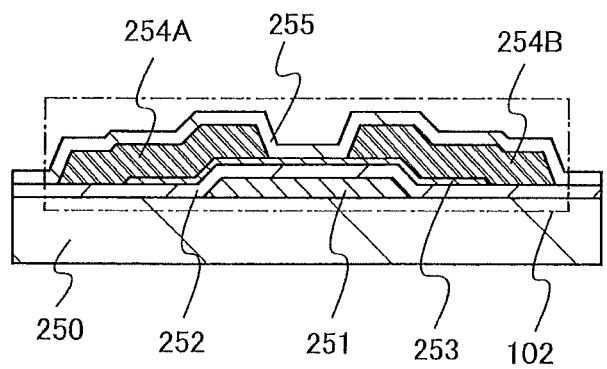
FIG. 10 is a cross-sectional view illustrating a semiconductor device of one embodiment of the present invention.

In the field-effect transistor 102 illustrated in FIG. 10, a gate 251 formed of a conductive layer is provided over a substrate 250, a gate insulating layer 252 is provided over the gate 251, an i-type or substantially i-type oxide semiconductor layer 253 is provided over the gate insulating layer 252, a first terminal 254A and a second terminal 254B formed of a conductive layer are provided so as to cover part of the oxide semiconductor layer 253, and an insulating layer 255 is provided so as to cover the oxide semiconductor layer 253, the first terminal 254A, and the second terminal 254B.

As the substrate 250, the substrate 200 described in Embodiment 2 can be used as appropriate.

The gate 251 can be formed using any of the materials for the first gate 201 described in Embodiment 2 as appropriate.

The gate insulating layer 252 can be formed using any of the materials for the gate insulating layer 202 described in Embodiment 2 as appropriate. The thickness of the gate insulating layer 252 can be greater than or equal to 50 nm and less than or equal to 500 nm. When the thickness of the gate insulating layer 252 is large, gate leakage current can be reduced.

The oxide semiconductor layer 253 can be formed using the metal oxide described as the material for the oxide semiconductor layer 203 in Embodiment 2. Further, an oxide semiconductor having an amorphous structure, a polycrystalline structure, or a single crystal structure can be employed as appropriate. Furthermore, an oxide semiconductor having a crystal structure with a crystal in which the c-axis is approximately parallel to a direction perpendicular to a surface can be used. Note that since the oxide semiconductor layer 253 is i-type or substantially i-type, the carrier density is lower than $5 \times 10^{14}/cm^3$, preferably lower than $1 \times 10^{12}/cm^3$, more preferably lower than or equal to $1 \times 10^{11}/cm^3$. Moreover, it is preferably that hydrogen and oxygen deficiency serving as a donor be little, and the hydrogen concentration be lower than or equal to $1 \times 10^{16}/cm^3$.

The field-effect transistor 102 which includes an i-type or substantially i-type oxide semiconductor layer in a channel region, which is purified by drastically removing hydrogen and in which oxygen deficiency is reduced to satisfy the stoichiometric composition ratio, whereby the off-state current can be smaller than or equal to $1 \times 10^{-16}$ A. In other words, a circuit can be designed with the oxide semiconductor layer that can be regarded as an insulator when a field-effect transistor is in a non-conducting state. On the other hand, when the field-effect transistor is in a conducting state, the current supply capability of the oxide semiconductor layer 253 is expected to be higher than the current supply capability of a semiconductor layer formed of amorphous silicon. Therefore, the field-effect transistor 102 is an enhancement type transistor, which is normally off with an extremely small leakage current in an off state; thus, the field-effect transistor 102 has excellent switching characteristics.

The first terminal 254A and the second terminal 254B can be formed using the material for the first terminal 204A and the second terminal 204B in Embodiment 2 as appropriate.

The insulating layer 255 is preferably formed using an oxide insulating layer. As a typical example of the oxide insulating layer, a silicon oxide layer, a silicon oxynitride layer, or an aluminum oxide layer can be given. Note that the insulating layer 205 may have a stacked structure of an oxide insulating layer and a nitride insulating layer. As a typical example of the nitride insulating layer, a silicon nitride layer, a silicon nitride oxide layer, or an aluminum nitride layer can be given. In the insulating layer 255, a region in contact with the oxide semiconductor layer 253 is formed using an oxide insulating layer, whereby oxygen deficiency of the oxide semiconductor layer can be reduced and the stoichiometric composition ratio can be satisfied.

Note that a structure of the field-effect transistor 102 can employ various modes without being limited to a specific structure. For example, a multi-gate structure with two or more of gates can be employed. Further, a structure where gate electrodes are provided above and below a channel region can be used. Note that when gate electrodes are provided above and below a channel region, it is possible to employ a structure where two field-effect transistors are connected in parallel.

Here, the method for manufacturing the field-effect transistor 102 illustrated in FIG. 10 will be described with reference to FIGS. 11A to 11D.

Figure 11A:
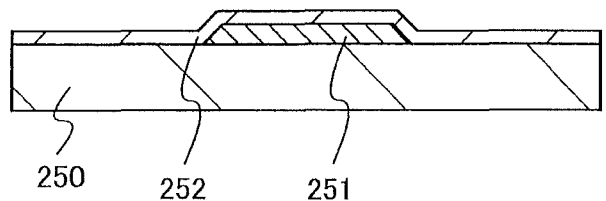
FIGS. 11A to 11D are cross-sectional views illustrating manufacturing steps of a semiconductor device of one embodiment of the present invention.

As illustrated in FIG. 11A, the gate 251 is formed over the substrate 250. Next, the gate insulating layer 252 is formed over the gate 251.

The gate 251 can be formed by the method for manufacturing the first gate 201 described in Embodiment 2 as appropriate. The gate insulating layer 252 can be formed by the method for manufacturing the gate insulating layer 202 described in Embodiment 2 as appropriate. Since an i-type or substantially i-type oxide semiconductor layer is highly sensitive to an interface state and interface charge, the gate insulating layer 252 is formed by high-density plasma CVD with the use of microwaves, so that the interface state density can be reduced and favorable interface characteristics can be obtained.

Note that the substrate 200 is heated when the gate insulating layer 252 is formed, whereby hydrogen, water, a hydroxyl group, hydride, or the like contained in the gate insulating layer 252 can be reduced.

In the case where the gate insulating layer 252 is formed by a sputtering method, the gate insulating layer 252 is preferably formed while hydrogen, water, a hydroxyl group, hydride, or the like remaining in a treatment chamber is removed in order that hydrogen, water, a hydroxyl group, hydride, or the like contained in the gate insulating layer 252 is reduced. An entrapment vacuum pump is preferably used for removing hydrogen, water, a hydroxyl group, hydride, or the like remaining in the treatment chamber. As an example of the entrapment vacuum pump, a cryopump, an ion pump, or a titanium sublimation pump can be given. Further, a turbo pump provided with a cold trap can be used for an exhaustion unit.

When the purity of a sputtering gas used for forming the gate insulating layer 252 is higher than or equal to 6N (99.9999%), preferably higher than or equal to 7N (99.99999%) (that is, the impurity concentration is lower than or equal to 1 ppm, preferably lower than or equal to 0.1 ppm), hydrogen, water, a hydroxyl group, hydride, or the like contained in the gate insulating layer 252 can be reduced.

Figure 11B:
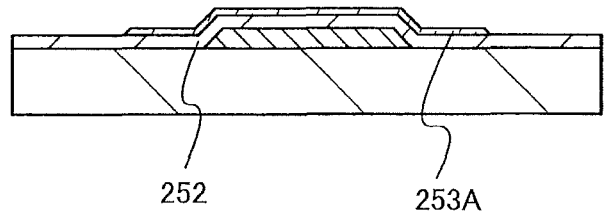

Next, as illustrated in FIG. 11B, an oxide semiconductor layer 253A is formed over the gate insulating layer 202. The oxide semiconductor layer 253A can be formed by a printing method, an inkjet method, or the like. Alternatively, the island-shaped oxide semiconductor layer 253A can be formed in such a manner that an oxide semiconductor layer is formed over the gate insulating layer 252 by a sputtering method, a CVD method, a coating method, a pulsed laser deposition method, or the like and the oxide semiconductor layer is etched with the use of a resist formed in a photolithography step as a mask.

The carrier density of an oxide semiconductor layer depends on a deposition condition such as the hydrogen concentration and the oxygen concentration of a source gas and a target, a material for deposition, composition of the material, or a condition of heat treatment. When the hydrogen concentration of the oxide semiconductor layer is made lower, or the oxygen concentration of the oxide semiconductor layer is increased and oxygen deficiency is reduced, the oxide semiconductor layer becomes i-type or substantially i-type. In this embodiment, because treatment in which the oxide semiconductor layer is processed into an i-type or substantially i-type oxide semiconductor layer is performed in a later step, the oxide semiconductor layer 253A may be either i-type or n-type.

The substrate is heated in the case where the oxide semiconductor layer is formed by a sputtering method, whereby an impurity such as hydrogen, water, a hydroxyl group, or hydride contained in the oxide semiconductor layer can be reduced. Further, crystal growth can be promoted in first heat treatment.

In the case where the oxide semiconductor layer is formed by a sputtering method, the relative density of the metal oxide in the metal oxide target is higher than or equal to 80%, preferably higher than or equal to 95%, further preferably higher than or equal to 99.9%, whereby the impurity concentration in the oxide semiconductor layer can be reduced; thus, a transistor having excellent electrical characteristics and high reliability can be obtained.

Further, when preheat treatment is performed before formation of the oxide semiconductor layer, hydrogen, water, a hydroxyl group, hydride, or the like remaining on an inner wall of the sputtering apparatus, on a surface of the target, or in a target material can be removed, so that an impurity such as hydrogen, water, a hydroxyl group, or hydride contained in the oxide semiconductor layer can be reduced.

As in the gate insulating layer 252, before, during, or after formation of the oxide semiconductor layer, it is preferable to use an entrapment vacuum pump for removing hydrogen, water, a hydroxyl group, hydride, or the like remaining in the sputtering apparatus. As a result, hydrogen, water, a hydroxyl group, hydride, or the like is evacuated, and the concentration of hydrogen, water, a hydroxyl group, hydride, or the like contained in the oxide semiconductor layer can be reduced.

Figure 11C:
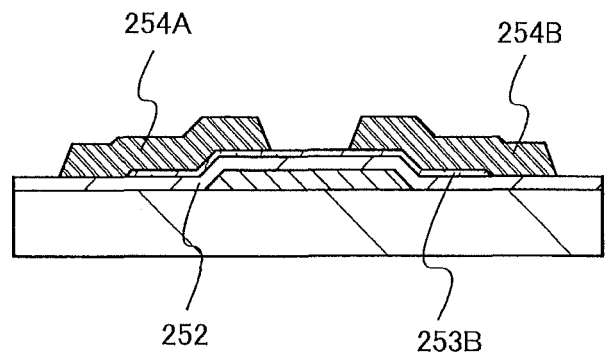

Next, first heat treatment is performed, so that an impurity such as hydrogen, water, a hydroxyl group, or hydride contained in the oxide semiconductor layer 253A is removed. That is, at least dehydration or dehydrogenation can be performed. Note that oxygen deficiency in the oxide semiconductor layer 253A is also formed in the first heat treatment. In FIG. 11C, the oxide semiconductor layer from which an impurity such as hydrogen, water, a hydroxyl group, or hydride is removed by the first heat treatment is referred to as an oxide semiconductor layer 253B.

The temperature of the first heat treatment is higher than or equal to 400° C. and lower than or equal to 750° C., preferably higher than or equal to 400° C. and lower than the strain point of the substrate. A heat treatment apparatus used for the first heat treatment is not limited to a particular apparatus, and the apparatus may be provided with a device for heating an object to be processed by heat radiation or heat conduction from a heating element such as a resistance heating element. For example, an electric furnace, or a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

It is preferable that in the first heat treatment, hydrogen, water, a hydroxyl group, hydride, or the like be not contained in nitrogen or a rare gas such as helium, neon, or argon. Alternatively, the purity of nitrogen or a rare gas such as helium, neon, or argon introduced into a heat treatment apparatus is preferably higher than or equal to 6N (99.9999%), more preferably higher than or equal to 7N (99.99999%) (that is, the impurity concentration is lower than or equal to 1 ppm, preferably lower than or equal to 0.1 ppm).

Further, in the first heat treatment, an atmosphere inside the furnace may be a nitrogen atmosphere at the time of increasing the temperature and the atmosphere may be switched to an oxygen atmosphere at the time of performing cooling. When the atmosphere is switched to an oxygen atmosphere after dehydration or dehydrogenation in a nitrogen atmosphere, oxygen can be supplied into the oxide semiconductor layer, the hydrogen concentration can be reduced, and oxygen can be supplied to oxygen deficiency in the oxide semiconductor layer, whereby an i-type or substantially i-type oxide semiconductor layer can be formed.

Further, depending on the conditions of the first heat treatment or the material of the oxide semiconductor layer, the oxide semiconductor layer 253A might be crystallized to be an oxide semiconductor layer including crystals. For example, an oxide semiconductor layer including crystals with a crystallinity of 90% or higher, or 80% or higher, is formed in some cases.

Depending on the conditions of the first heat treatment or the materials of the oxide semiconductor layer, the oxide semiconductor layer has a crystal structure with a crystal in which the c-axis is approximately parallel to a direction perpendicular to a surface is formed over a surface portion of an amorphous oxide semiconductor layer in some cases.

Note that the first heat treatment may be performed after the first terminal and the second terminal are formed over the oxide semiconductor layer.

Here, the substrate is introduced into an electric furnace and the heat treatment is performed in an inert gas atmosphere such as nitrogen or a rare gas at 450° C. for one hour.

Next, as illustrated in FIG. 11C, the first terminal 254A and the second terminal 254B which serve as a source electrode and a drain electrode are formed.

The first terminal 254A and the second terminal 254B can be formed in a manner similar to that of the first terminal 204A and the second terminal 204B described in Embodiment 2.

Figure 11D:
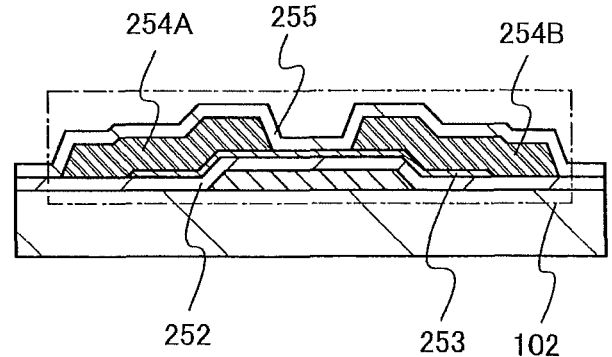

Next, as illustrated in FIG. 11D, the insulating layer 255 is formed over the gate insulating layer 252, the oxide semiconductor layer 253B, the first terminal 254A, and the second terminal 254B. The insulating layer 255 can be formed by a sputtering method, a CVD method, a printing method, a coating method, or the like. Note that when a silicon oxide layer is formed by a sputtering method as the insulating layer 255, oxygen can be supplied from the silicon oxide layer to the oxygen deficiency which is generated in the first heat treatment and included in the oxide semiconductor layer 253A; thus, oxygen deficiency serving as a donor can be reduced and a structure satisfying the stoichiometric composition ratio can be obtained. As a result, the i-type or substantially i-type oxide semiconductor layer 253 can be formed.

Next, second heat treatment (preferably, at higher than or equal to 200° C. and lower than or equal to 400° C., for example, at higher than or equal to 250° C. and lower than or equal to 350° C.) is performed in an inert gas atmosphere or in an oxygen gas atmosphere. The second heat treatment may be performed after a protective insulating layer or a planarization insulating layer is formed over the insulating layer 255. By this heat treatment, oxygen can be supplied from the insulating layer 255 formed using an oxide insulating layer to the oxygen deficiency which is generated in the first heat treatment and included in the oxide semiconductor layer; thus, oxygen deficiency serving as a donor can be reduced and a structure satisfying the stoichiometric composition ratio can be obtained. As a result, the more i-type or substantially i-type oxide semiconductor layer 253 can be formed.

In this embodiment, the second heat treatment is performed in a nitrogen atmosphere at 250° C. for one hour.

Further, heat treatment may be performed in air at higher than or equal to 100° C. and lower than or equal to 200° C. for longer than or equal to 1 hour and shorter than or equal to 30 hours. Reliability of a field-effect transistor can be increased by the heat treatment.

Through the above steps, the enhancement type field-effect transistor 102 can be manufactured which includes an i-type or substantially i-type oxide semiconductor layer in a channel region and has extremely small off-state current.

Embodiment 5

Figure 12:
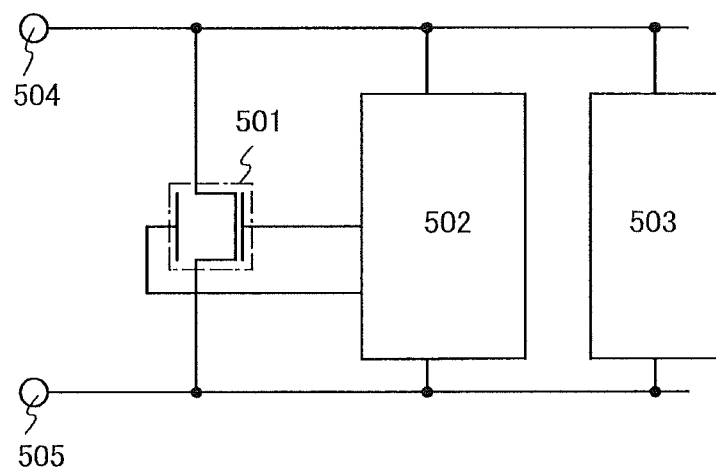
FIG. 12 is an equivalent circuit diagram illustrating a semiconductor device of one embodiment of the present invention.

FIG. 12 is one embodiment of a semiconductor device in which the power element described in any of Embodiments 1 to 3 is used for a protective element. The protective element functions so that current flows through the power element which is a protective element and overcurrent does not flow through a circuit to be protected when overvoltage is input to a power source terminal. The circuit to be protected includes any circuit with low withstand voltage which is broken by application of overvoltage. In this embodiment, as an example of a power element, description will be given with the use of the power MOSFET having four terminals described in Embodiments 1 and 2.

FIG. 12 is a semiconductor device including a power MOSFET 501, a control circuit 502, a circuit 503 to be protected, an input terminal 504, and an output terminal 505. The control circuit 502 controls operation of the power MOSFET 501 serving as a protective element by detecting overvoltage applied to the input terminal 504 or the output terminal 505.

Figure 13:
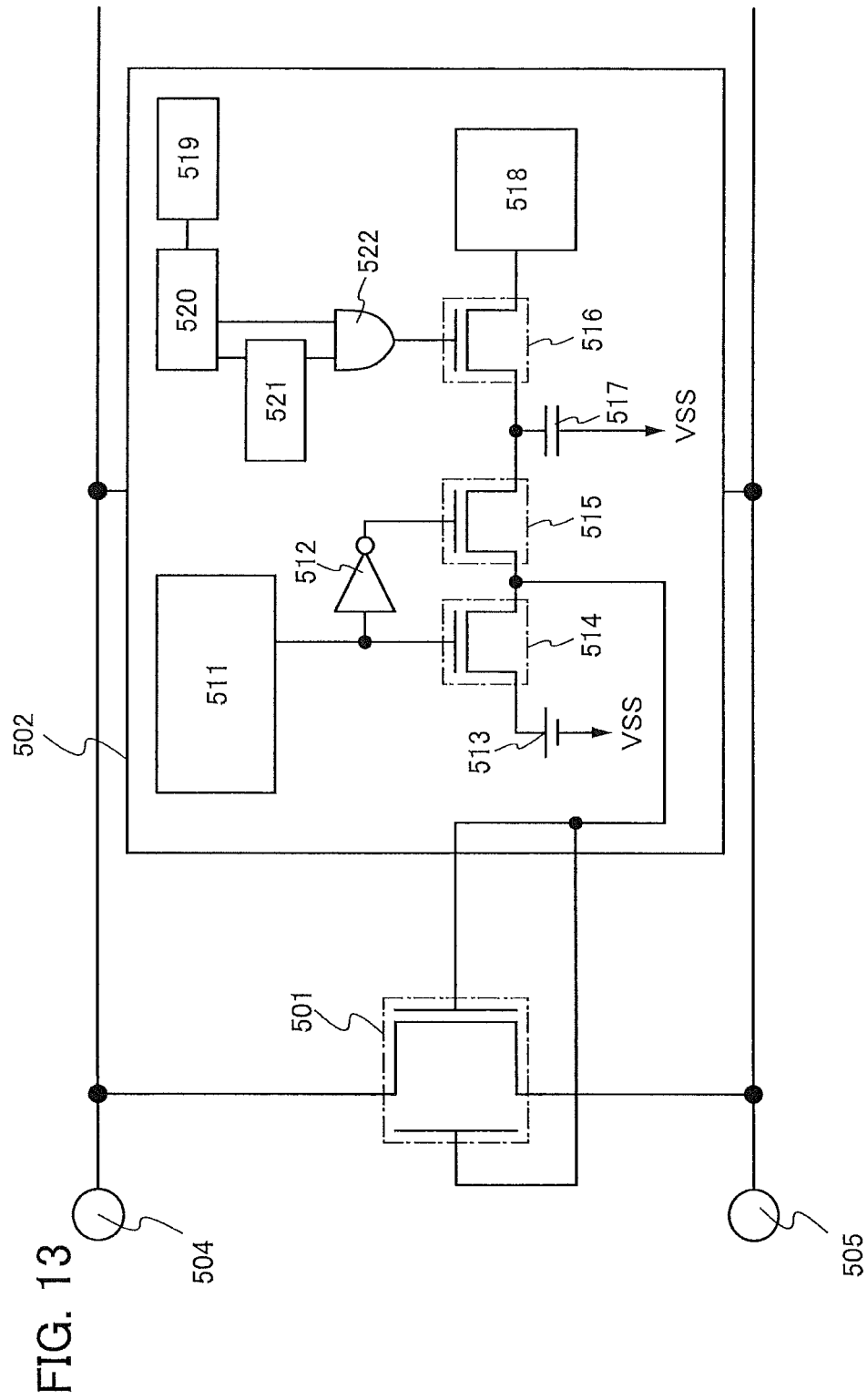
FIG. 13 is an equivalent circuit diagram illustrating a semiconductor device of one embodiment of the present invention.

FIG. 13 is a detailed diagram of the control circuit 502. The control circuit 502 includes an overvoltage detection circuit 511, an inverter 512, a positive power source 513, switch transistors 514, 515, and 516, a capacitor 517, a negative voltage generation circuit 518, an oscillator circuit 519, a divider circuit 520, a delay circuit 521, and an AND circuit 522. The positive power source 513 corresponds to the high voltage generation source 108 in Embodiment 1. The switch transistors 514, 515, and 516 correspond to the field-effect transistors 102, 103, and 104 in Embodiment 1, respectively. The capacitor 517 corresponds to the capacitor 105 in Embodiment 1. The negative voltage generation circuit 518 corresponds to the low voltage generation source 109 in Embodiment 1. The oscillator circuit 519, the divider circuit 520, the delay circuit 521, and the AND circuit 522 correspond to the refresh control circuit 107 in Embodiment 1. Note that the structure of the control circuit 502 is not limited to this structure.

Next, operation of the control circuit 502 and the power MOSFET 501 in FIG. 13 will be described. The overvoltage detection circuit 511 is a circuit which operates in the case where overvoltage which exceeds normal power supply voltage is input to the input terminal 504. In this embodiment, the overvoltage detection circuit 511 has a function of outputting a pulse having a high potential in the case where overvoltage is input.

An output terminal of the overvoltage detection circuit 511 is connected to a gate terminal of the switch transistor 514 and an input terminal of the inverter 512. An output terminal of the inverter 512 is connected to a gate terminal of the switch transistor 515. Thus, when overvoltage is input, the switch transistor 514 is turned on, a gate terminal of the power MOSFET 501 is connected to the positive power source 513, and the power MOSFET 501 is turned on. Accordingly, current flows from the input terminal 504 to the output terminal 505, and overvoltage is prevented from flowing through the circuit 503 to be protected in FIG. 12.

Figure 17:
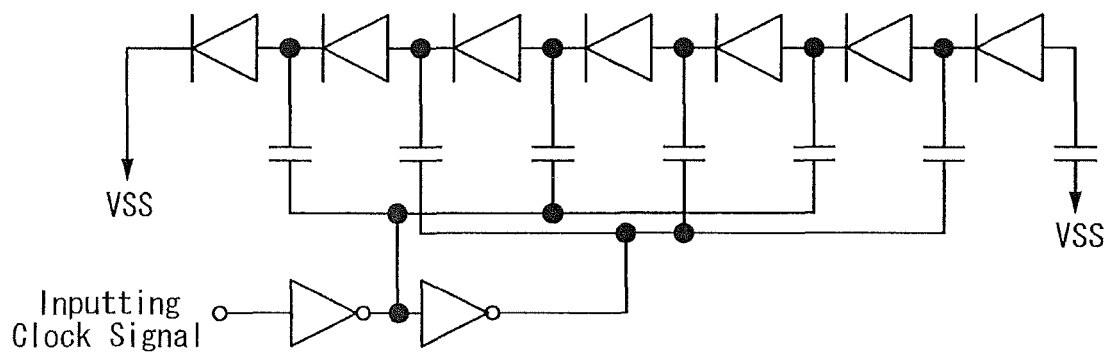
FIG. 17 is an equivalent circuit diagram illustrating a semiconductor device of one embodiment of the present invention.

When overvoltage is not applied, output from the overvoltage detection circuit 511 is low; therefore, the switch transistor 514 is off state and the switch transistor 515 is on state. The negative voltage generation circuit 518 includes a charge pump circuit in FIG. 17 and the like to generate negative voltage.

Since the protective circuit does not frequently operate, it is not appropriate to constantly feed a large amount of current in terms of power consumption. Accordingly, it is effective in terms of reduction in power consumption that the capacitor 517 is charged with the use of a small electric capacity. Therefore, power consumption can be reduced in such a manner that the capacitor 517 is intermittently charged by the negative voltage generation circuit 518 through the switch transistor 516.

A signal in which an oscillation signal generated in the oscillator circuit 519 is divided by the divider circuit 520, and the divided signal is supplied to a gate terminal of the switch transistor 516. That is, one of output terminals of the divider circuit 520 is connected to a first input terminal of the AND circuit 522. The other of the output terminals of the divider circuit 520 is connected to a second input terminal of the AND circuit 522 through the delay circuit 521. Thus, a pulse which has a pulse width equivalent to delayed time of the delay circuit 521 and a cycle similar to output of the divider circuit 520 can be obtained. With the use of the pulse, the gate terminal of the switch transistor 516 can be controlled.

As the oscillator circuit 519, a general oscillator circuit such as a ring oscillator can be used, but it is not limited thereto. Further, a flip-flop can be used for the divider circuit 520. As the delay circuit 521, a circuit using an inverter, a circuit using a CR delay circuit, or the like can be used, but it is not particularly limited thereto. Furthermore, a pulse can be generated by other methods.

Thus, negative voltage is held in the capacitor 517, and when overvoltage is not applied, the negative voltage is applied to the power MOSFET 501 through the switch transistor 515. The power MOSFET 501 is in an off state during the negative voltage is applied to the gate terminal of the power MOSFET 501; accordingly, current does not flow.

Figure 14:
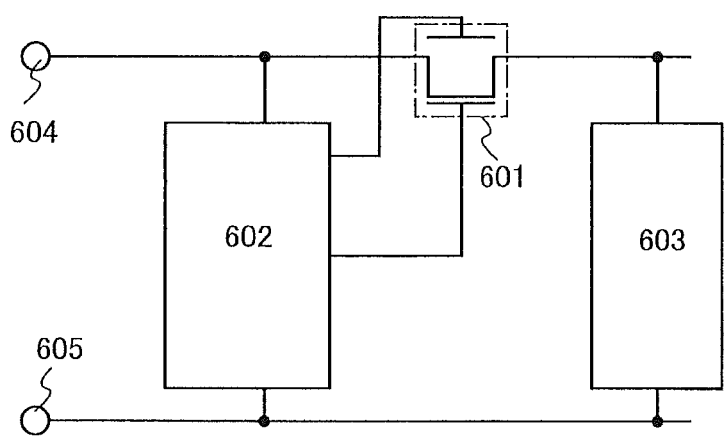
FIG. 14 is an equivalent circuit diagram illustrating a semiconductor device of one embodiment of the present invention.

FIG. 14 is a semiconductor device in which a power MOSFET and a circuit to be protected are connected in series. Unlike FIG. 12, a power MOSFET 601 is turned off and application of overvoltage to a circuit 603 to be protected is prevented when overvoltage is applied to an input terminal.

The semiconductor device shown in FIG. 14 includes a power MOSFET 601, a control circuit 602, a circuit 603 to be protected, an input terminal 604, and an output terminal 605. The control circuit 602 controls the power MOSFET 601 serving as a protective element by detecting overvoltage applied to the input terminal 604 or the output terminal 605.

Figure 15:
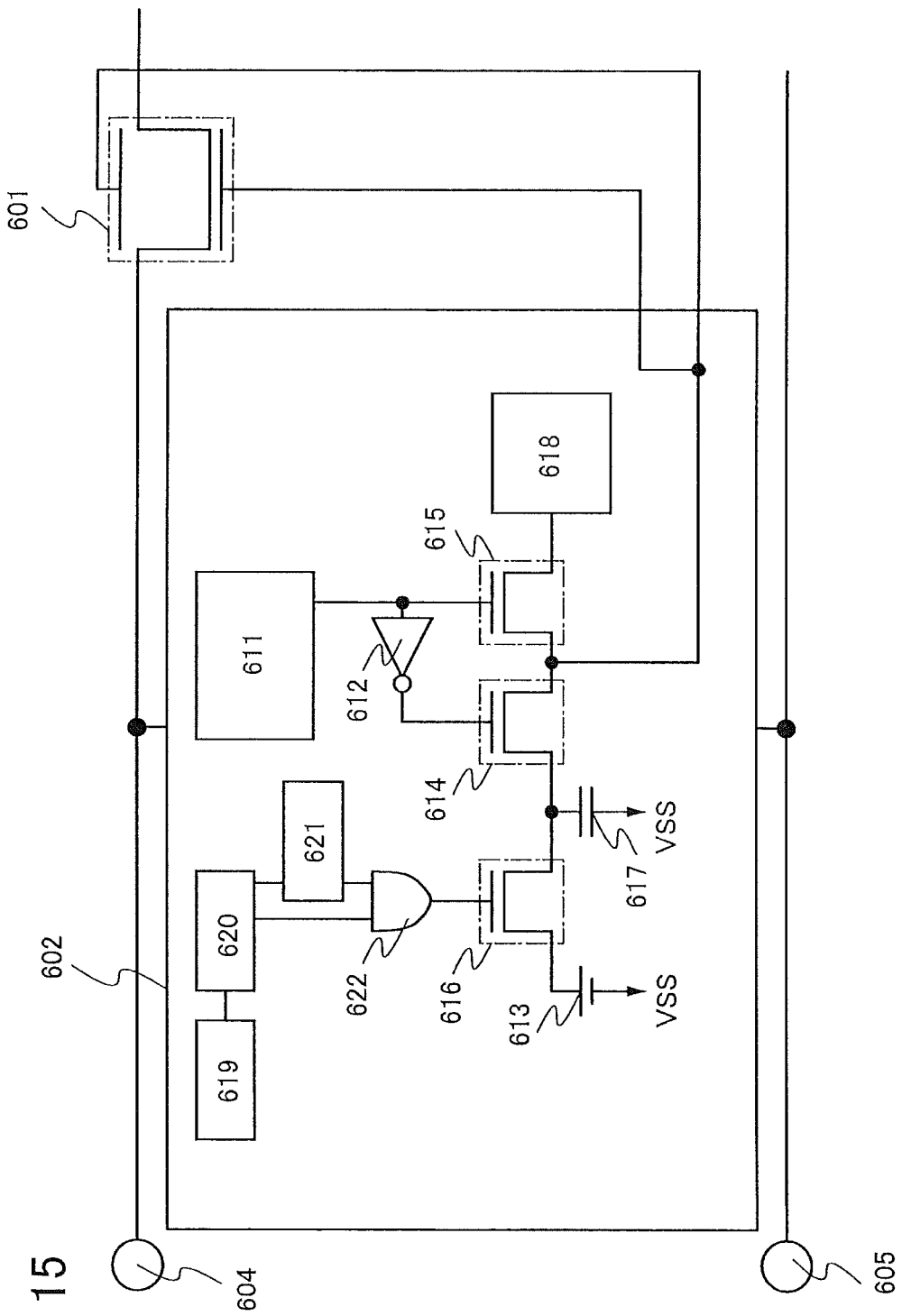
FIG. 15 is an equivalent circuit diagram illustrating a semiconductor device of one embodiment of the present invention.

FIG. 15 is a detailed diagram of the control circuit 602. The control circuit 602 includes an overvoltage detection circuit 611, an inverter 612, a positive power source 613, switch transistors 614, 615, and 616, a capacitor 617, a negative voltage generation circuit 618, an oscillator circuit 619, a divider circuit 620, a delay circuit 621, and an AND circuit 622. The positive power source 613 corresponds to the high voltage generation source 108 in Embodiment 1. The switch transistors 614, 615, and 616 correspond to the field-effect transistors 103, 102, and 104 in Embodiment 1, respectively. The capacitor 617 corresponds to the capacitor 105 in Embodiment 1. The negative voltage generation circuit 618 corresponds to the low voltage generation source 109 in Embodiment 1. The oscillator circuit 619, the divider circuit 620, the delay circuit 621, and the AND circuit 622 correspond to the refresh control circuit 107 in Embodiment 1. Note that the structure of the control circuit 602 is not limited to this structure.

Next, operation of the control circuit 602 and the power MOSFET 601 in FIG. 15 will be described. The overvoltage detection circuit 611 is a circuit which operates in the case where overvoltage which exceeds normal power supply voltage is input to the input terminal 604. In this embodiment, the overvoltage detection circuit 611 has a function of outputting a pulse having a high potential in the case where overvoltage is input in this embodiment.

An output terminal of the overvoltage detection circuit 611 is connected to a gate terminal of the switch transistor 615 and the inverter 612. An output terminal of the inverter 612 is connected to a gate terminal of the switch transistor 614. Thus, when overvoltage is input to the input terminal 604, the switch transistor 615 is turned on, a gate terminal of the power MOSFET 601 is connected to the negative voltage generation circuit 618, and the power MOSFET 601 is turned off. Accordingly, the input terminal 604 and the circuit 603 to be protected are disconnected, and overvoltage is prevented from flowing through the circuit 603 to be protected. The negative voltage generation circuit 618 includes a charge pump circuit in FIG. 17 and the like to generate negative voltage.

When overvoltage is not applied, output of the overvoltage detection circuit 611 is low; therefore, the switch transistor 615 is off, the switch transistor 614 is on, and the gate terminal of the power MOSFET 601 is connected to the capacitor 617. Since positive voltage from a positive power source is held in the capacitor 617 to be described later, the power MOSFET 601 is in on state.

Since the protective circuit does not frequently operate, it is not appropriate to constantly feed a large amount of current in terms of power consumption. Accordingly, it is effective in terms of reduction in power consumption that the capacitor 617 is charged with a small electric capacity. Therefore, power consumption can be reduced in such a manner that the capacitor 617 is intermittently charged by the positive power source 613 through the switch transistor 616.

A signal in which an oscillation signal generated in the oscillator circuit 619 is divided by the divider circuit 620, and the divided signal is supplied to a gate terminal of the switch transistor 616. That is, one of output terminals of the divider circuit 620 is connected to a first input terminal of the AND circuit 622. The other of the output terminal of the divider circuit 620 is connected to a second input terminal of the AND circuit 622 through the delay circuit 621. Thus, a pulse which has a pulse width equivalent to delayed time of the delay circuit 621 and a cycle similar to output of the divider circuit 620 can be obtained. With the use of the pulse, the gate terminal of the switch transistor 616 can be controlled.

As the oscillator circuit 619, a general oscillator circuit such as a ring oscillator can be used, but it is not limited thereto. Further, a flip-flop can be used for the divider circuit 620. As the delay circuit 621, a circuit using an inverter, a circuit using a CR delay circuit, or the like can be used, but it is not particularly limited thereto. Furthermore, a pulse can be generated by other methods.

Thus, positive voltage is held in the capacitor 617, and when overvoltage is not applied, the positive voltage is applied to the power MOSFET 601 through the switch transistor 614. The power MOSFET 601 is in an on state during the positive voltage is applied to the gate terminal of the power MOSFET 601; accordingly, the input terminal 604 and the circuit 603 to be protected in FIG. 14 are connected to each other.

Figure 16:
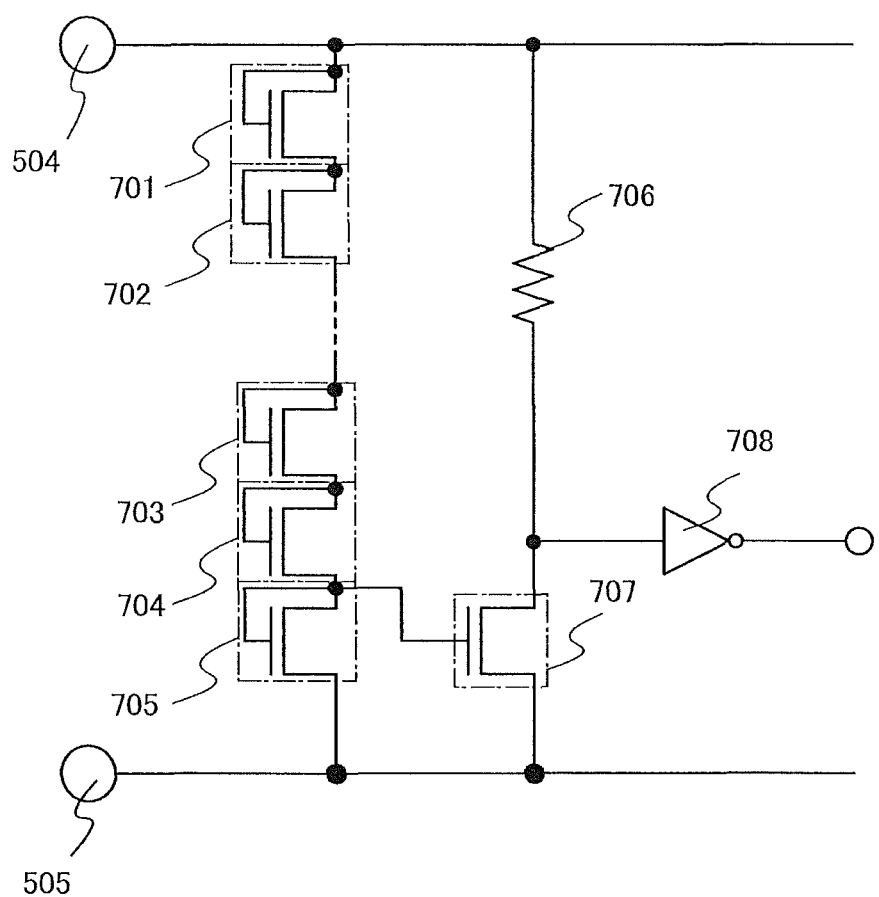
FIG. 16 is an equivalent circuit diagram illustrating a semiconductor device of one embodiment of the present invention.

FIG. 16 is an example of structures of the overvoltage detection circuits 511 and 611. In FIG. 16, a diode chain in which transistors 701 to 705 are diode-connected, a transistor 707, a resistor 706, and an inverter 708 are included. When the diode chain includes n transistors connected in series and the threshold voltage of a transistor is Vth, n is set so that normal operation voltage<nVth is satisfied. The transistors 701 to 705 are turned on when overvoltage is applied, and thus current flows through the diode chain. When the transistor 705 is turned on, the transistor 707 is also turned on and a high potential is output from an output of the inverter 708.

In this embodiment, a normally-on power MOSFET which includes an oxide semiconductor layer with a wide band gap in a channel region is used as a protective element; thus, destruction of a semiconductor device due to application of overvoltage can be prevented.

Embodiment 6

In this embodiment, applications of the power device described in the above embodiments will be described. The semiconductor device which is the power device described in the above embodiments can be used, for example, for a protective circuit of a battery in an electronic device such as a computer display that can display images; and a protective circuit of a battery provided for an electromagnetic cooker or a vehicle (e.g., a bicycle) that is driven with power from a fixed power source.

Application examples of a semiconductor device which is a power device functioning as a protective circuit will be described with reference to FIGS. 18A to 18C.

Figure 18A:
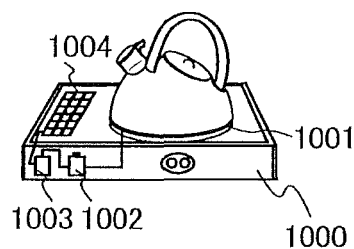
FIGS. 18A to 18C illustrate electronic devices.

FIG. 18A illustrates an electromagnetic cooker 1000 as an application example of a semiconductor device serving as a protective circuit. The electromagnetic cooker 1000 heats cookware and the like by using electromagnetic induction generated by current flowing through a coil unit 1001. The electromagnetic cooker 1000 includes a battery 1002 for supplying current that is to flow through the coil unit 1001, a semiconductor device 1003 serving as a protective circuit, and a solar battery 1004 for charging the battery 1002. Although the solar battery 1004 is illustrated as a means to charge the battery 1002 in FIG. 18A, the battery 1002 may be charged by another means. The semiconductor device 1003 serving as a protective circuit can reduce application of overvoltage to the battery 1002 and thus, it is possible to reduce power consumption when the protective circuit is not operated.

Figure 18B:
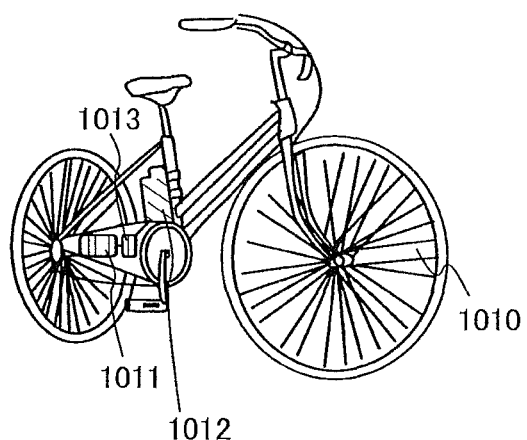

FIG. 18B illustrates an electric bicycle 1010 as an application example of a semiconductor device serving as a protective circuit. The electric bicycle 1010 obtains power when current flows through a motor unit 1011. The electric bicycle 1010 includes a battery 1012 for supplying current that is to flow through the motor unit 1011 and a semiconductor device 1013 serving as a protective circuit. Although a means to charge the battery 1012 is not particularly illustrated in FIG. 18B, the battery 1012 may be charged by an electric generator or the like that is additionally provided. The semiconductor device 1013 serving as a protective circuit can reduce application of overvoltage to the battery 1012 in charging and thus, it is possible to reduce power consumption when the protective circuit is not operated. Note that although a pedal is illustrated in FIG. 18B, the pedal is not necessarily provided.

Figure 18C:
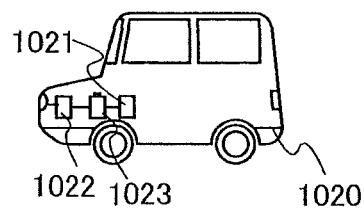

FIG. 18C illustrates an electric car 1020 as an application example of a semiconductor device serving as a protective circuit. The electric car 1020 obtains power when current flows through a motor unit 1021. Moreover, the electric car 1020 includes a battery 1022 for supplying current that is to flow through the motor unit 1021 and a semiconductor device 1023 serving as a protective circuit. Although a means to charge the battery 1022 is not particularly illustrated in FIG. 18C, the battery 1022 may be charged by an electric generator or the like that is additionally provided. The semiconductor device 1023 serving as a protective circuit can reduce application of overvoltage to the battery 1022 in charging and thus, it is possible to reduce power consumption when the protective circuit is not operated.

Note that in this embodiment, what is described in this embodiment with reference to the drawings can be freely combined with or replaced with what is described in other embodiments as appropriate.

This application is based on Japanese Patent Application serial no. 2010-012627 filed with Japan Patent Office on Jan. 22, 2010, the entire contents of which are hereby incorporated by reference.

EXPLANATION OF REFERENCE

100: control circuit, 101: power MOSFET, 101A: power MOSFET, 101B: power MOSFET, 102: field-effect transistor, 103: field-effect transistor, 104: field-effect transistor, 105: capacitor, 106: overvoltage detection circuit, 107: refresh control circuit, 108: high voltage generation source, 109: low voltage generation source, 110: power element, 111A: power MOSFET, 111B: power MOSFET, 121: power element, 200: substrate, 201: gate, 201A: gate, 202: gate insulating layer, 203: oxide semiconductor layer, 204A: terminal, 204B: terminal, 205: insulating layer, 206: gate, 206A: gate, 208: region, 209: off-set region, 211: gate, 212: gate insulating layer, 213: oxide semiconductor layer, 214: wiring, 215: wiring, 250: substrate, 251: gate, 252: gate insulating layer, 253: oxide semiconductor layer, 253A: oxide semiconductor layer, 253B: oxide semiconductor layer, 254A: terminal, 254B: terminal, 255: insulating layer, 401: capacitor, 501: power MOSFET, 502: control circuit, 503: circuit, 504: input terminal, 505: output terminal, 511: overvoltage detection circuit, 512: inverter, 513: positive power source, 514: switch transistor, 515: switch transistor, 516: switch transistor, 517: capacitor, 518: negative voltage generation circuit, 519: oscillator circuit, 520: divider circuit, 521: delay circuit, 522: AND circuit, 601: power MOSFET, 602: control circuit, 603: circuit, 604: input terminal, 605: output terminal, 611: overvoltage detection circuit, 612: inverter, 613: positive power source, 614: switch transistor, 615: switch transistor, 616: switch transistor, 617: capacitor, 618: negative voltage generation circuit, 619: oscillator circuit, 620: divider circuit, 621: delay circuit, 622: AND circuit, 701: transistor, 702: transistor, 703: transistor, 704: transistor, 705: transistor, 706: resistor, 707: transistor, 708: inverter, 1000: electromagnetic cooker, 1001: coil unit, 1002: battery, 1003: semiconductor device, 1004: solar battery, 1010: electric bicycle, 1011: motor unit, 1012: battery, 1013: semiconductor device, 1020: electric car, 1021: motor unit, 1022: battery, 1023: semiconductor device.

The invention claimed is:

1. A semiconductor device comprising:
   a first conductive layer;
   a first insulating layer over the first conductive layer;
   an oxide semiconductor layer over the first insulating layer;
   a source electrode over and electrically connected to the oxide semiconductor layer;
   a drain electrode over and electrically connected to the oxide semiconductor layer;
   a second insulating layer over the oxide semiconductor layer; and
   a second conductive layer over the second insulating layer,
   wherein the oxide semiconductor layer comprises:
      a first region that is in contact with one of the source electrode and the drain electrode and overlaps with the first conductive layer and the second conductive layer;
      a second region that is not in contact with any of the source electrode and the drain electrode and overlaps with the first conductive layer and the second conductive layer;
      a third region that is not in contact with any of the source electrode and the drain electrode, overlaps with the first conductive layer, and does not overlap with the second conductive layer; and
      a fourth region that is in contact with the other of the source electrode and the drain electrode, overlaps with the first conductive layer, and does not overlap with the second conductive layer, and
   wherein an end portion of the second conductive layer overlaps with the one of the source electrode and the drain electrode.

2. The semiconductor device according to claim 1, wherein the second conductive layer is not in contact with the source electrode and the drain electrode.

3. The semiconductor device according to claim 1, wherein the first insulating layer comprises oxygen.

4. The semiconductor device according to claim 1, wherein the oxide semiconductor layer comprises In, Zn, and one of Ga, Al, and B.

5. The semiconductor device according to claim 1,
   wherein the oxide semiconductor layer comprises a crystal, and wherein a c-axis of the crystal is along a direction perpendicular to a surface of the oxide semiconductor layer.

6. The semiconductor device according to claim 1, wherein the oxide semiconductor layer comprises a region in which a carrier density is larger than or equal to $1\times10^{16}$ cm$^{-3}$ and smaller than or equal to $1\times10^{20}$ cm$^{-3}$.

7. The semiconductor device according to claim 1, wherein the oxide semiconductor layer comprises a region in which a hydrogen concentration is larger than or equal to $1\times10^{16}$ cm$^{-3}$ and smaller than or equal to $1\times10^{20}$ cm$^{-3}$.

8. The semiconductor device according to claim 1, wherein the source electrode and the drain electrode each comprise an alloy comprising Cu and Mn.

9. The semiconductor device according to claim 1, wherein the source electrode and the drain electrode are each in contact with a side surface of the oxide semiconductor layer.

10. The semiconductor device according to claim 1, comprising a transistor comprises the first conductive layer, the first insulating layer, the oxide semiconductor layer, the source electrode, the drain electrode, the second insulating layer, and the second conductive layer, wherein the transistor is a power metal oxide semiconductor field-effect transistor (power MOSFET).

11. A semiconductor device comprising:
a transistor comprising:
an oxide semiconductor layer;
a source electrode over the oxide semiconductor layer;
a drain electrode over the oxide semiconductor layer;
a gate insulating layer over the oxide semiconductor layer; and
a gate electrode over the gate insulating layer,
wherein the oxide semiconductor layer comprises a portion not overlapping with any of the source electrode, the drain electrode, and the gate electrode, and
wherein the portion is positioned between the source electrode and the drain electrode.

12. The semiconductor device according to claim 11, wherein the oxide semiconductor layer comprises In, Ga, and Zn.

13. The semiconductor device according to claim 11, wherein the gate electrode overlaps with one of part of the source electrode and part of the drain electrode.

14. The semiconductor device according to claim 11, wherein the oxide semiconductor layer comprises a crystal, and
wherein a c-axis of the crystal is along a direction perpendicular to a surface of the oxide semiconductor layer.

15. The semiconductor device according to claim 11, wherein the oxide semiconductor layer comprises a region in which a carrier density is larger than or equal to $1\times10^{16}$ cm$^{-3}$ and smaller than or equal to $1\times10^{20}$ cm$^{-3}$.

16. The semiconductor device according to claim 11, wherein the oxide semiconductor layer comprises a region in which a hydrogen concentration is larger than or equal to $1\times10^{16}$ cm$^{-3}$ and smaller than or equal to $1\times10^{20}$ cm$^{-3}$.

17. The semiconductor device according to claim 11, wherein the source electrode and the drain electrode are each in contact with a side surface of the oxide semiconductor layer.

18. The semiconductor device according to claim 11, wherein the gate insulating layer is over the source electrode and the drain electrode.

19. The semiconductor device according to claim 11, wherein the transistor is a power metal oxide semiconductor field-effect transistor (power MOSFET).

20. The semiconductor device according to claim 1, wherein the third region is located between the first region and the fourth region.

21. A semiconductor device comprising:
a transistor comprising:
a first gate electrode;
a first gate insulating layer over the first gate electrode;
an oxide semiconductor layer over the first gate insulating layer;
a source electrode over the oxide semiconductor layer;
a drain electrode over the oxide semiconductor layer;
a second gate insulating layer over the oxide semiconductor layer; and
a second gate electrode over the second gate insulating layer,
wherein the oxide semiconductor layer comprises a portion not overlapping with any of the source electrode, the drain electrode, and the second gate electrode, and
wherein the portion is positioned between the source electrode and the drain electrode.

22. The semiconductor device according to claim 21, wherein the oxide semiconductor layer comprises In, Ga, and Zn.

23. The semiconductor device according to claim 21, wherein the first gate electrode overlaps with one of part of the source electrode and part of the drain electrode.

24. The semiconductor device according to claim 21, wherein the second gate electrode overlaps with one of part of the source electrode and part of the drain electrode.

25. The semiconductor device according to claim 21, wherein the first gate electrode and the second gate electrode overlap with one of part of the source electrode and part of the drain electrode.

26. The semiconductor device according to claim 21,
wherein the oxide semiconductor layer comprises a crystal, and
wherein a c-axis of the crystal is along a direction perpendicular to a surface of the oxide semiconductor layer.

27. The semiconductor device according to claim 21, wherein the oxide semiconductor layer comprises a region in which a carrier density is larger than or equal to $1\times10^{16}$ cm$^{-3}$ and smaller than or equal to $1\times10^{20}$ cm$^{-3}$.

28. The semiconductor device according to claim 21, wherein the oxide semiconductor layer comprises a region in which a hydrogen concentration is larger than or equal to $1\times10^{16}$ cm$^{-3}$ and smaller than or equal to $1\times10^{20}$ cm$^{-3}$.

29. The semiconductor device according to claim 21, wherein the source electrode and the drain electrode are each in contact with a side surface of the oxide semiconductor layer.

30. The semiconductor device according to claim 21, wherein the second gate insulating layer is over the source electrode and the drain electrode.

31. The semiconductor device according to claim 21, wherein the portion of the oxide semiconductor layer overlaps with the first gate electrode.

32. The semiconductor device according to claim 21, wherein the portion of the oxide semiconductor layer does not overlap with the first gate electrode.

33. The semiconductor device according to claim 21, wherein the first gate insulating layer and the second gate insulating layer are partly in contact with each other.

34. The semiconductor device according to claim 21, wherein the transistor is a power metal oxide semiconductor field-effect transistor (power MOSFET).

35. A semiconductor device comprising:
a first conductive layer;
a first insulating layer over the first conductive layer;
an oxide semiconductor layer over the first insulating layer;
a second conductive layer over and electrically connected to the oxide semiconductor layer;
a third conductive layer over and electrically connected to the oxide semiconductor layer;
a second insulating layer over the oxide semiconductor layer; and
a fourth conductive layer over the second insulating layer, wherein the oxide semiconductor layer comprises:
  a first region that is in contact with the second conductive layer and overlaps with the first conductive layer and the fourth conductive layer;
  a second region that is not in contact with any of the second conductive layer and the third conductive layer and overlaps with the first conductive layer and the fourth conductive layer;
  a third region that is not in contact with any of the second conductive layer and the third conductive layer, overlaps with the first conductive layer, and does not overlap with the fourth conductive layer; and
  a fourth region that is in contact with the third conductive layer, overlaps with the first conductive layer, and does not overlap with the fourth conductive layer, and
wherein an end portion of the fourth conductive layer overlaps with the second conductive layer.

36. The semiconductor device according to claim 35, wherein the fourth conductive layer is not in contact with the second conductive layer and the third conductive layer.

37. The semiconductor device according to claim 35, wherein the first insulating layer comprises oxygen.

38. The semiconductor device according to claim 35, wherein the oxide semiconductor layer comprises In, Zn, and one of Ga, Al, and B.

39. The semiconductor device according to claim 35,
wherein the oxide semiconductor layer comprises a crystal, and
wherein a c-axis of the crystal is along a direction perpendicular to a surface of the oxide semiconductor layer.

40. The semiconductor device according to claim 35, wherein the oxide semiconductor layer comprises a region in which a carrier density is larger than or equal to $1\times10^{16}$ cm$^{-3}$ and smaller than or equal to $1\times10^{20}$ cm$^{-3}$.

41. The semiconductor device according to claim 36, wherein the oxide semiconductor layer comprises a region in which a hydrogen concentration is larger than or equal to $1\times10^{16}$ cm$^{-3}$ and smaller than or equal to $1\times10^{20}$ cm$^{-3}$.

42. The semiconductor device according to claim 35, wherein the second conductive layer and the third conductive layer each comprise an alloy comprising Cu and Mn.

43. The semiconductor device according to claim 35, wherein the second conductive layer and the third conductive layer are each in contact with a side surface of the oxide semiconductor layer.

44. The semiconductor device according to claim 35, comprising a transistor comprises the first conductive layer, the first insulating layer, the oxide semiconductor layer, the second conductive layer, the third conductive layer, the second insulating layer, and the fourth conductive layer, wherein the transistor is a power metal oxide semiconductor field-effect transistor (power MOSFET).

45. The semiconductor device according to claim 35, wherein the third region is located between the first region and the fourth region.

* * * * *